(12) United States Patent
Sung et al.

(10) Patent No.: US 12,489,838 B2
(45) Date of Patent: Dec. 2, 2025

(54) ELECTRONIC DEVICE

(71) Applicants: Samsung Display Co., Ltd., Yongin-Si (KR); Seoul National University R&DB Foundation, Seoul (KR)

(72) Inventors: Eunjin Sung, Yongin-si (KR); Jungsuek Oh, Seoul (KR); Kiseo Kim, Yongin-si (KR); Sangrock Yoon, Hwaseong-si (KR); Byeongjin Kim, Seoul (KR); Jeongtaek Oh, Seoul (KR)

(73) Assignees: Samsung Display Co., Ltd., Yongin-si (KR); Seoul National University R&DB Foundation, Seoul (KR)

( * ) Notice: Subject to any disclaimer, the term of this patent is extended or adjusted under 35 U.S.C. 154(b) by 557 days.

(21) Appl. No.: 17/983,333

(22) Filed: Nov. 8, 2022

(65) Prior Publication Data
US 2023/0208958 A1 Jun. 29, 2023

(30) Foreign Application Priority Data

Dec. 28, 2021 (KR) .................. 10-2021-0190302
Jul. 5, 2022 (KR) .................. 10-2022-0082264
Jul. 21, 2022 (KR) .................. 10-2022-0090540

(51) Int. Cl.
*H04M 1/02* (2006.01)
*H10K 59/131* (2023.01)

(52) U.S. Cl.
CPC ........ *H04M 1/0266* (2013.01); *H10K 59/131* (2023.02)

(58) Field of Classification Search
None
See application file for complete search history.

(56) References Cited

U.S. PATENT DOCUMENTS 10,622,703 B2    4/2020   Bin et al.
2021/0013626 A1*  1/2021   Jang .................. H01Q 1/2258
2021/0200379 A1*  7/2021   Youk .................. G06F 3/0443

FOREIGN PATENT DOCUMENTS

KR   10-2019-0069226 A    6/2019
KR   10-2046564 B1       11/2019
KR   10-2021-0007526 A    1/2021
KR   10-2248849 B1        5/2021

OTHER PUBLICATIONS

Junho Park, Seung Yoon Lee, Jongmin Kim, Dongpil Park, Woo Choi, and Wonbin Hong, "An Optically Invisible Antenna-on-Display Concept for Millimeter-Wave 5G Cellular Devices", in IEEE Transactions on Antennas and Propagation, vol. 67, No. 5, pp. 2942-2952, 12 pages, Feb. 22, 2019, United States.

* cited by examiner

*Primary Examiner* — Duane N Taylor, Jr.
(74) *Attorney, Agent, or Firm* — Innovation Counsel LLP

(57) ABSTRACT

Provided is an electronic device comprising a display layer in which an active area and a peripheral area adjacent to the active area are defined and a cover layer disposed under the display layer, wherein the display layer includes a base layer, a circuit layer disposed on the base layer and including a transistor and a feeding part, and a light emitting element layer disposed on the circuit layer and including a light emitting element electrically connected to the transistor, wherein the feeding part is disposed on the same layer as a part of the transistor, and includes a coplanar waveguide, wherein, when viewed on a plane, the cover layer overlaps the feeding part.

36 Claims, 26 Drawing Sheets

ELECTRONIC DEVICE

CROSS-REFERENCE TO RELATED APPLICATIONS

This U.S. non-provisional patent application claims priority under 35 U.S.C. § 119 of Korean Patent Application No. 10-2021-0190302, filed on Dec. 28, 2021, No. 10-2022-0082264 filed on Jul. 5, 2022, and No. 10-2022-0090540 filed on Jul. 21, 2022 the entire contents of which are hereby incorporated by reference.

BACKGROUND

The present disclosure generally relates to an electronic device. More particularly, the present disclosure relates to an electronic device capable of improving frequency signal emission performance.

The electronic device may include electronic modules. For example, the electronic device may be a portable terminal or a wearable device, and the electronic modules may include an antenna module, a camera module, or a battery module. As portable terminals become thinner and wearable devices become smaller, the space in which electronic modules are mounted is gradually reduced. In addition, as the electronic device becomes highly functional and develops into a high specification, the number of electronic modules included in the electronic device is increasing.

SUMMARY

The present disclosure provides an electronic device having improved frequency signal radiation performance.

An embodiment of the present disclosure provides an electronic device including: a display layer in which an active area and a peripheral area adjacent to the active area are defined; and a cover layer disposed under the display layer, wherein the display layer includes: a base layer; a circuit layer disposed on the base layer and including a transistor and a feeding part; and a light emitting element layer disposed on the circuit layer and including a light emitting element electrically connected to the transistor, wherein the feeding part is disposed on the same layer as a part of the transistor, and includes a coplanar waveguide, wherein when viewed on a plane, the cover layer overlaps the feeding part.

In an embodiment, the circuit layer may further include a first antenna pattern disposed on the same layer as the feeding part.

In an embodiment, the first antenna pattern may be provided integrally with the feeding part.

In an embodiment, the electronic device may further include a sensor layer disposed on the display layer and including a sensing electrode.

In an embodiment, when viewed on the plane, the sensing electrode may non-overlap with the feeding part.

In an embodiment, the first antenna pattern may be spaced apart from the sensing electrode in a first direction.

In an embodiment, the first antenna pattern may be provided in plurality, wherein the plurality of first antenna patterns may be spaced apart from the feeding part in a first direction, wherein each of the plurality of first antenna patterns may be spaced apart from each other in a second direction intersecting the first direction.

In an embodiment, the first antenna pattern may include the same material as the transistor.

In an embodiment, when viewed on the plane, the first antenna pattern may overlap the cover layer.

In an embodiment, the electronic device may further include a driving chip for providing a signal to the first antenna pattern through the feeding part.

In an embodiment, the transistor may be disposed in the active area, wherein the feeding part may be disposed in the peripheral area.

In an embodiment, the electronic device may further include an antenna layer disposed on the display layer and including a second antenna pattern.

In an embodiment, the second antenna pattern may be electrically connected to the feeding part.

In an embodiment of the present disclosure, an electronic device includes: a display layer in which an active area and a peripheral area adjacent to the active area are defined; and a cover layer disposed under the display layer and including a conductive material, wherein the display layer includes: a base layer; a circuit layer disposed on the base layer and including a transistor, a feeding part, and an antenna pattern connected to the feeding part; and a light emitting element layer disposed on the circuit layer and including a light emitting element electrically connected to the transistor, wherein the antenna pattern is disposed on the same layer as a portion of the transistor, wherein the transistor is disposed in the active area, and the antenna pattern is disposed in the peripheral area.

In an embodiment, the feeding part may include a coplanar waveguide.

In an embodiment, the electronic device may further include a sensor layer disposed on the display layer and including a sensing electrode.

In an embodiment, when viewed on a plane, the sensing electrode may non-overlap with the feeding part.

In an embodiment, the antenna pattern may include the same material as the transistor.

In an embodiment, the electronic device may further include a driving chip electrically connected to the feeding part and providing a signal to the antenna pattern.

In an embodiment, the antenna pattern may be provided in plurality, wherein the plurality of antenna patterns may be spaced apart from the feeding part in a first direction, wherein each of the plurality of antenna patterns may be spaced apart from each other in a second direction intersecting the first direction.

In an embodiment of the present disclosure, an electronic device including a display layer in which an active area and a peripheral area adjacent to the active area are defined, wherein the display layer includes: a base layer; a circuit layer disposed on the base layer and including a transistor, a ground electrode, and a feeding part; and a light emitting element layer disposed on the circuit layer and including a light emitting element electrically connected to the transistor, wherein the feeding part is disposed on the same layer as a part of the transistor, wherein the feeding part is spaced apart from the ground electrode in a first direction, the feeding part extends in a second direction intersecting the first direction, and the feeding part, and the ground electrode are connected to each other in the second direction to be provided integrally.

In an embodiment, the feeding part and the ground electrode may form a slotted loop dipole antenna.

In an embodiment, the electronic device may further include a sensor layer disposed on the display layer and including a sensing electrode.

In an embodiment, a first slot and a second slot spaced apart from each other in the first direction with the feeding part therebetween may be defined in the ground electrode, wherein each of the first slot and the second slot may have a shape extending in the first direction.

In an embodiment, an area of each of the first slot and the second slot may be the same.

In an embodiment, a first area of the first slot and a second area of the second slot may be different from each other.

In an embodiment, at least one opening part adjacent to the first slot or the second slot may be defined in the ground electrode, wherein the opening part may be further spaced apart from the sensing electrode in the second direction than the first slot and the second slot.

In an embodiment, the feeding part may be provided in plurality, and the plurality of feeding parts may be arranged along the first direction.

In an embodiment, when viewed on a plane, the sensing electrode may not overlap the feeding part.

In an embodiment, the ground electrode may be spaced apart from the sensing electrode in the second direction.

In an embodiment, the feeding part and the ground electrode may include the same material as the transistor.

In an embodiment, the electronic device may further include a driving chip for providing a signal to the feeding part.

In an embodiment, the transistor may be disposed in the active area, wherein the feeding part may be disposed in the peripheral area.

In an embodiment, the electronic device may further include a cover layer disposed under the display layer, wherein when viewed on a plane, the cover layer may overlap the feeding part.

In an embodiment, when viewed on a plane, the ground electrode may overlap the cover layer.

In an embodiment, the feeding part may include a coplanar waveguide.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
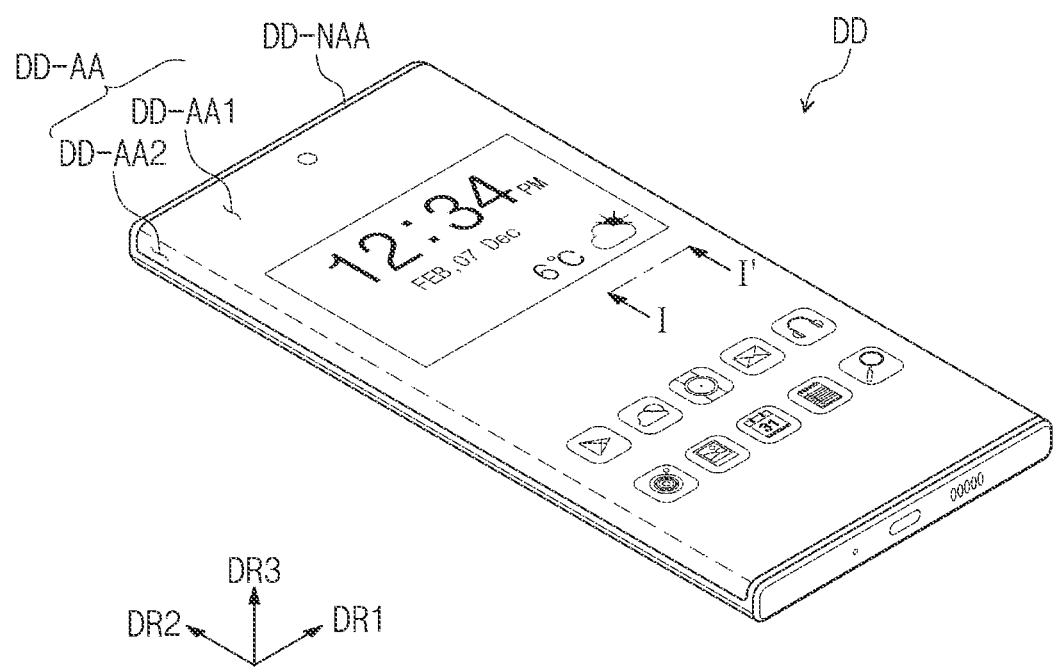
FIG. 1 is a perspective view of an electronic device according to an embodiment of the present disclosure.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description. "And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this present disclosure belongs. In addition, terms such as terms defined in commonly used dictionaries should be interpreted as having a meaning consistent with the meaning in the context of the related technology, and it should not be construed in an overly ideal or overly formal sense unless explicitly defined here.

Hereinafter, embodiments of the present disclosure will be described with reference to the drawings.

FIG. 1 is a perspective view of an electronic device according to an embodiment of the present disclosure.

Referring to FIG. 1, an electronic device DD may be a device that is activated according to an electrical signal. For example, the electronic device DD may be a mobile phone, a tablet, a navigation device, a game machine, or a wearable device, but is not limited thereto. FIG. 1 illustrates that the electronic device DD is a mobile phone.

An active area DD-AA and a peripheral area DD-NAA may be defined in the electronic device DD. An image may be displayed in the active area DD-AA. The peripheral area DD-NAA may be disposed adjacent to the active area DD-AA.

The active area DD-AA includes a first display surface DD-AA1 and a second display surface DD-AA2. The first display surface DD-AA1 parallel to a surface defined by the first direction DR1 and a second direction DR2 crossing the first direction DR1, and the second display surface DD-AA2 extending from the first display surface DD-AA1 may be defined in the active area DD-AA.

The second display surface DD-AA2 may be provided by being bent from one side of the first display surface DD-AA1. Alternatively, a plurality of second display surfaces DD-AA2 may be provided. In this case, the second display surface DD-AA2 may be provided by being bent from at least two sides of the first display surface DD-AA1. One first display surface DD-AA1 and one or more and four or less second display surfaces DD-AA2 may be defined in the active area DD-AA. However, the shape of the active area DD-AA is not limited thereto, and only the first display surface DD-AA1 may be defined in the active area DD-AA.

The thickness direction of the electronic device DD may be parallel to the third direction DR3 crossing the first direction DR1 and the second direction DR2. Accordingly, the front surface (or upper surface) and the rear surface (or lower surface) of the members constituting the electronic device DD may be defined based on the third direction DR3.

Figure 2:
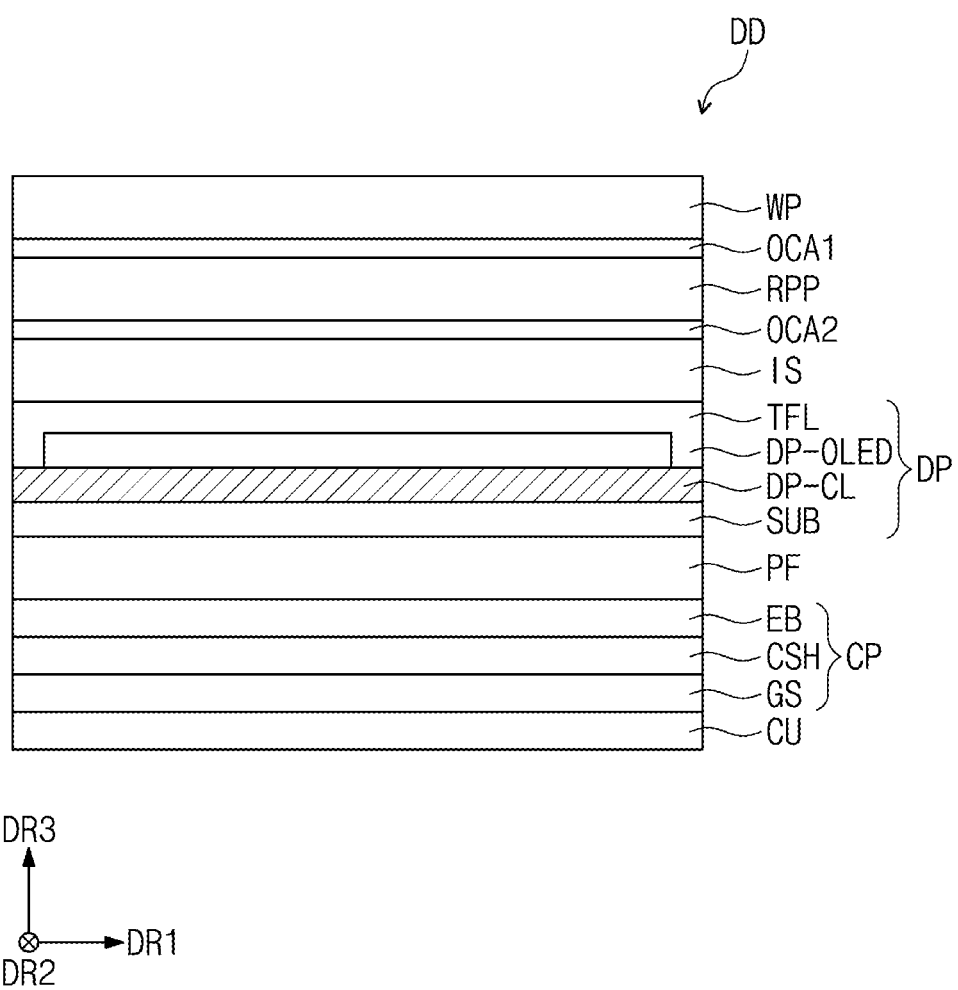
FIG. 2 is a schematic cross-sectional view of an electronic device according to an embodiment of the present disclosure.

FIG. 2 is a schematic cross-sectional view of an electronic device according to an embodiment of the present disclosure.

Referring to FIG. 2, the electronic device DD may include a window WP, a plurality of adhesive layers OCA1, OCA2, and OCA3, an anti-reflection layer RPP, a sensor layer IS, a display layer DP, a protective layer PF, a lower member layer CP, and a cover layer CU.

The window WP may constitute an appearance of the electronic device DD. The window WP may protect the internal components of the electronic device DD from external impact and may be a configuration that substantially provides the active area DD-AA of the electronic device DD. For example, the window WP may include a glass substrate, a sapphire substrate, or a plastic film. The window WP may have a multi-layered or single-layered structure. For example, the window WP may have a laminated structure of a plurality of plastic films bonded with an adhesive, or a laminated structure of a glass substrate and a plastic film bonded with an adhesive.

The adhesive layer OCA1 may be disposed under the window WP. The window WP and the anti-reflection layer RPP may be coupled by the adhesive layer OCA1. The adhesive layer OCA1 may include a conventional adhesive or pressure-sensitive adhesive. For example, the adhesive layer OCA1 may be an optically clear adhesive film, an optically clear adhesive resin, or a pressure sensitive adhesive film.

An anti-reflection layer RPP may be disposed under the window WP. The anti-reflection layer RPP may reduce the reflectance of natural light (or sunlight) incident from above the window WP.

The anti-reflection layer RPP according to an embodiment of the present disclosure may include a retarder and a polarizer. The retarder may be a film type or a liquid crystal coating type, and may include a λ/2 retarder and/or a λ/4 retarder. The polarizer may be a film type or a liquid crystal coating type. The film type may include a stretchable synthetic resin film, and the liquid crystal coating type may include liquid crystals arranged in a predetermined arrangement. The retarder and the polarizer may further include a protective film. A retarder and a polarizer themselves or a protective film may be defined as the base layer of the anti-reflection layer RPP. However, this is an example and the anti-reflection layer RPP according to an embodiment of the present disclosure may be omitted.

The adhesive layer OCA2 may be disposed under the anti-reflection layer RPP. An anti-reflection layer RPP and an antenna layer ANL may be coupled by the adhesive layer OCA2. The adhesive layer OCA2 may include substantially the same material as the adhesive layer OCA1.

The sensor layer IS may acquire coordinate information of an external input. The sensor layer IS according to an embodiment of the present disclosure may be directly disposed on one surface of the display layer DP. For example, the sensor layer IS may be integrated with the display layer DP in an on-cell manner. The sensor layer IS may be manufactured by a continuous process with the display layer DP. However, the embodiment of the present disclosure is not limited thereto, and the sensor layer IS may be manufactured by a separate process and adhered to the display layer DP. The sensor layer IS may include a touch panel.

The display layer DP may be disposed under the sensor layer IS. The display layer DP may generate an image. The display layer DP may be a light emitting display layer, and is not particularly limited. For example, the display layer DP may include an organic light emitting display layer, a quantum dot display layer, a micro LED display layer, or a nano LED display layer. The display layer DP may include a base layer SUB, a circuit layer DP-CL, a light emitting element layer DP-OLED, and an encapsulation layer TFL. This will be described later.

The display layer DP may transmit, receive, or transmit/receive a wireless communication signal, for example, a radio frequency signal. The display layer DP may include a feeding part and an antenna pattern. The antenna pattern may transmit, receive, or transmit/receive a frequency band, or may transmit, receive, or transmit/receive a different frequency band. The feeding part and the antenna pattern will be described later.

A protective layer PF may be disposed under the display layer DP. The protective layer PF may protect the lower surface of the display layer DP. The protective layer PF may include polyethylene terephthalate (PET). However, the material of the protective layer PF is not particularly limited thereto.

The lower member layer CP may include an embossed layer EB, a cushion layer CSH, and a heat dissipation sheet GS.

The protective layer RPL may be disposed under the refractive layer RL. The embossed layer EB may be colored. For example, the embossed layer EB may be black. The embossed layer EB may absorb light incident to the embossed layer EB. The embossed layer EB may be a layer having adhesive properties on both surfaces. The embossed layer EB may include a conventional adhesive or pressure-sensitive adhesive. The protective layer PF and the cushion layer CSH may be combined by the embossed layer EB.

The cushion layer CSH may be disposed under the embossed layer EB. The cushion layer CSH may have a function of relieving pressure applied from the outside. The cushion layer CSH may include a sponge, foam, or urethane resin. The thickness of the cushion layer CSH may be thicker than the thickness of the embossed layer EB.

A heat dissipation sheet GS may be disposed under the cushion layer CSH. The heat dissipation sheet GS may induce the release of heat generated in the display layer DP. For example, the heat dissipation sheet GS may be a graphite sheet. In an embodiment of the present disclosure, a film layer may be further disposed between the cushion layer CSH and the heat dissipation sheet GS. The film layer may be made of polyimide (PI).

The cover layer CU may be disposed under the lower member layer CP. The cover layer CU may have conductivity. For example, the cover layer CU may include copper (Cu). For example, the cover layer CU may be a copper tape. However, the embodiment of the present disclosure is not particularly limited thereto. A ground voltage may be applied to the cover layer CU. However, this is an example and the cover layer CU may be floating.

Figure 3:
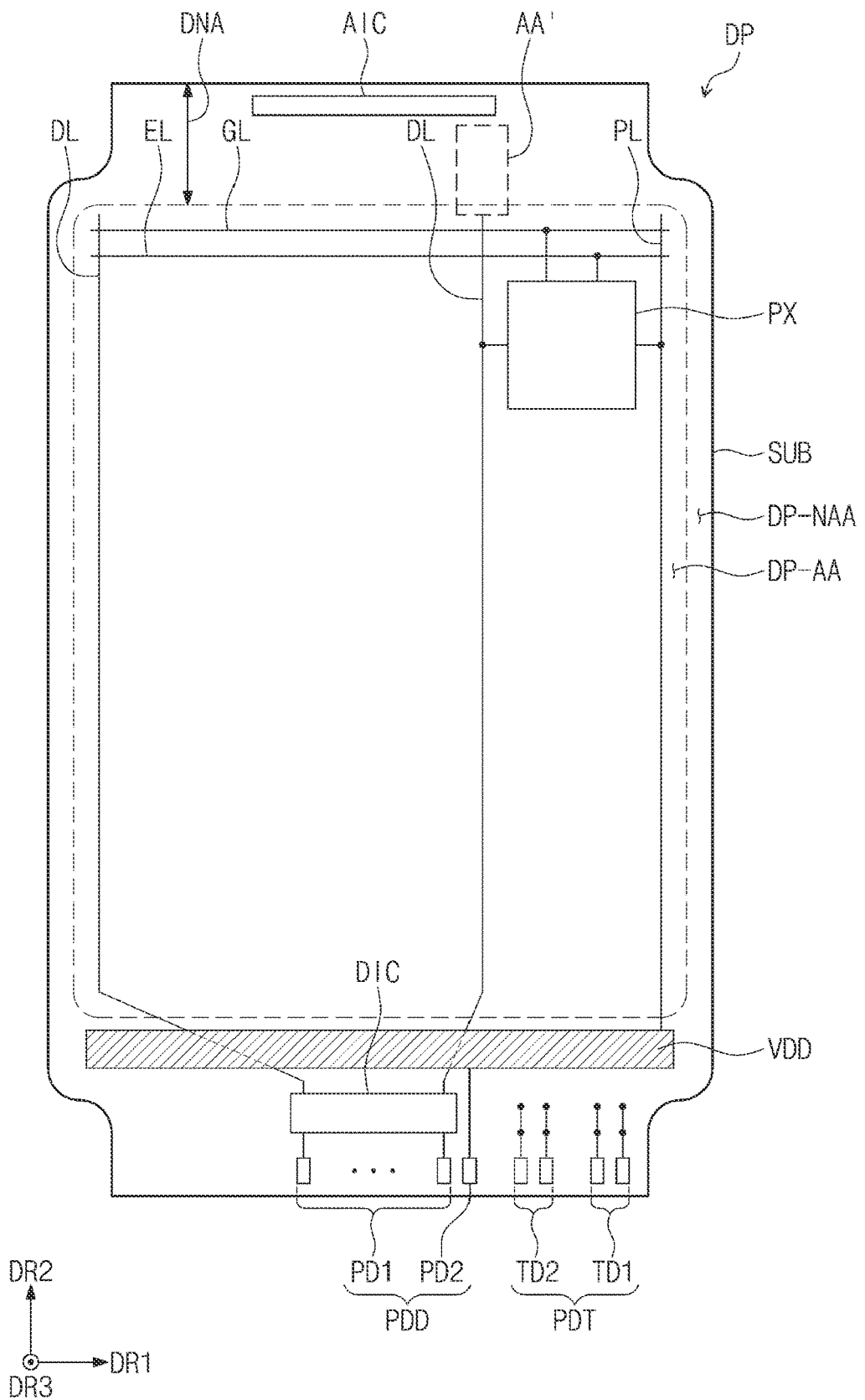
FIG. 3 is a plan view of a display layer according to an embodiment.

FIG. 3 is a plan view of a display layer according to an embodiment.

Referring to FIG. 3, an active area DP-AA and a peripheral area DP-NAA adjacent to the active area DP-AA may be defined in the display layer DP. The active area DP-AA may be an area in which an image is displayed. A plurality of pixels PX may be disposed in the active area DP-AA. The peripheral area DP-NAA may be an area in which a driving circuit or driving wiring is disposed. When viewed on a plane, the active area DP-AA may overlap the active area DD-AA (see FIG. 1) of the electronic device DD (see FIG. 1), and the peripheral area DP-NAA may overlap the peripheral area DD-NAA (see FIG. 1) of the electronic device DD (see FIG. 1).

The display layer DP may include a base layer SUB, a plurality of pixels PX, a plurality of signal wires GL, DL, PL, and EL, a plurality of display pads PDD, and a plurality of sensing pads PDT.

Each of the plurality of pixels PX may display one of primary colors or one of mixed colors. The primary colors may include red, green, or blue. The mixed color may include various colors such as white, yellow, cyan, and magenta. However, the color displayed by each of the pixels PX is not limited thereto.

The plurality of signal wires GL, DL, PL, and EL may be disposed on the base layer SUB. The plurality of signal wires GL, DL, PL, and EL may be connected to the plurality of pixels PX to transmit electrical signals to the plurality of pixels PX. The plurality of signal wires GL, DL, PL, and EL may include a plurality of scan wires GL, a plurality of data wires DL, a plurality of power wires PL, and a plurality of emission control wires EL. However, this is an example, and the configuration of the plurality of signal wires GL, DL, PL, and EL according to an embodiment of the present disclosure is not limited thereto. For example, the plurality of signal wires GL, DL, PL, and EL according to an embodiment of the present disclosure may further include an initialization voltage wire. In this embodiment, the plurality of data wires DL and the plurality of power wires PL extend along the second direction DR2, and the plurality of scan wires GL and the plurality of emission control wires EL extend along the first direction DR1.

The power pattern VDD may be disposed in the peripheral area DP-NAA. The power pattern VDD may be connected to a plurality of power wires PL. The display layer DP may include the power pattern VDD to provide the same power signal to the plurality of pixels PX.

The plurality of display pads PDD may be disposed in the peripheral area DP-NAA. The plurality of display pads PDD may include a first pad PD1 and a second pad PD2. A plurality of first pads PD1 may be provided. Each of the plurality of first pads PD1 may be connected to each of the plurality of data wires DL, respectively. The second pad PD2 may be connected to the power pattern VDD to be electrically connected to the plurality of power wires PL. The display layer DP may provide electrical signals provided from the outside through the plurality of display pads PDD to the plurality of pixels PX. Meanwhile, the plurality of display pads PDD may further include pads for receiving other electrical signals in addition to the first pad PD1 and the second pad PD2, and are not provided as an embodiment.

The driving circuit DIC may be mounted in the peripheral area DP-NAA. The driving circuit DIC may be a timing control circuit in the form of a chip. The plurality of data wires DL may be electrically connected to the plurality of first pads PD1 through the driving circuit DIC, respectively. However, this is an example, and the driving circuit DIC according to an embodiment may be mounted on a film separate from the display layer DP. In this case, the driving circuit DIC may be electrically connected to the plurality of display pads PDD through the film.

The plurality of sensing pads PDT may be disposed in a peripheral area DP-NAA. The plurality of sensing pads PDT may be electrically connected to the plurality of sensing electrodes of the sensor layer IS (see FIG. 3), which will be described later. The plurality of sensing pads PDT may include a plurality of first sensing pads TD1 and a plurality of second sensing pads TD2.

The feeding part PS (see FIG. 7) may be disposed in the peripheral area DP-NAA. A width DNA extending in the second direction DR2 of the peripheral area DP-NAA may be about 50 micrometer (μm) to about 400 μm. This will be described later.

A driving chip AIC may be disposed in a peripheral area DP-NAA. The driving chip AIC may provide a signal to the feeding part (see FIG. 7). The driving chip AIC may control the operation of an antenna. In an embodiment of the present disclosure, the driving chip AIC may be referred to as a beam forming chip AIC.

Figure 4:
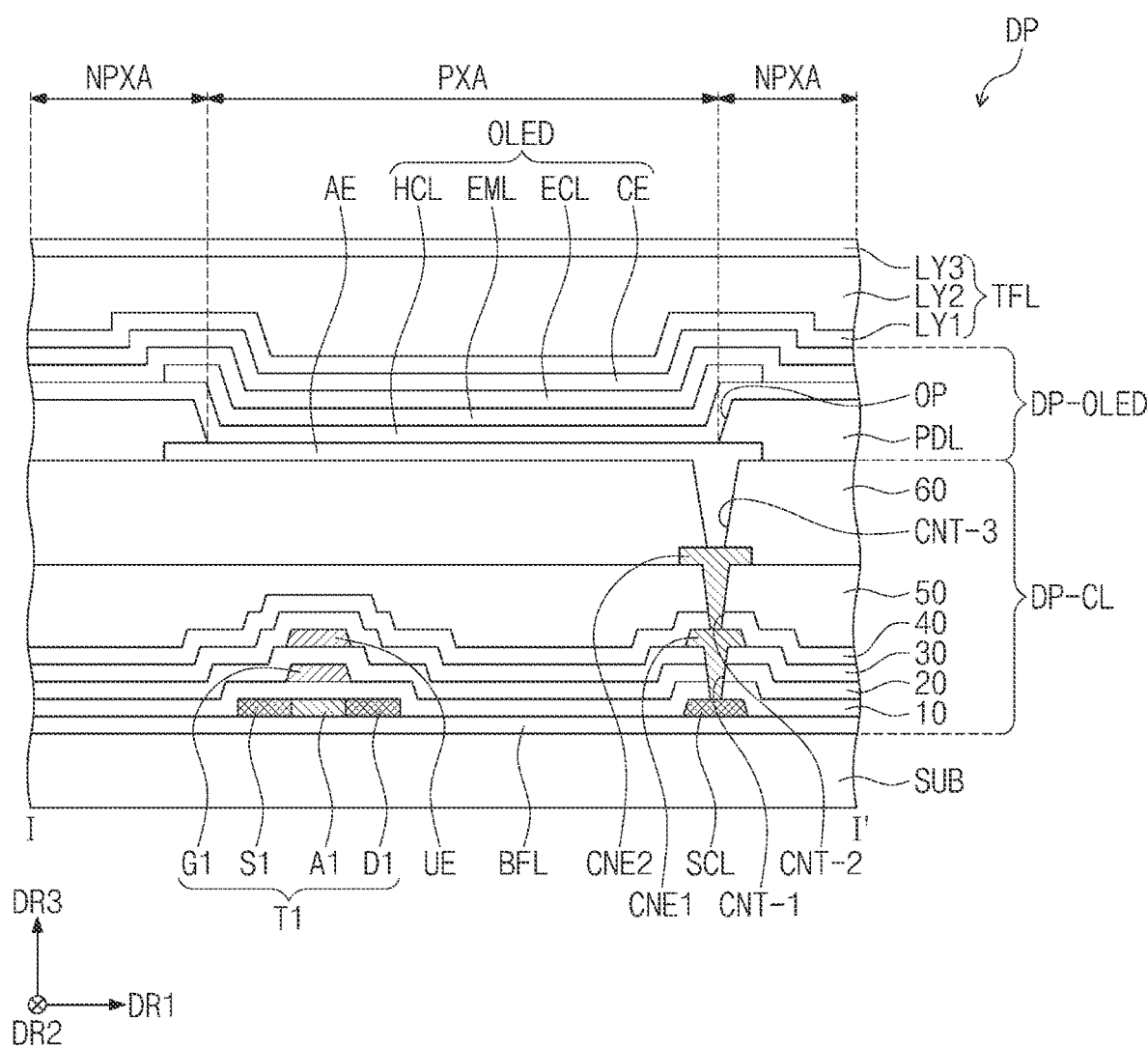
FIG. 4 is a cross-sectional view of a portion corresponding to the display layer taken along line I-I' of FIG. 1 according to an embodiment of the present disclosure.

FIG. 4 is a cross-sectional view of a portion corresponding to the display layer taken along line I-I' of FIG. 1 according to an embodiment of the present disclosure.

Referring to FIG. 4, the display layer DP may include a base layer SUB, a circuit layer DP-CL, a light emitting element layer DP-OLED, and an encapsulation layer TFL. The display layer DP may include a plurality of insulating layers, a semiconductor pattern, a conductive pattern, a signal line, and the like. An insulating layer, a semiconductor layer, and a conductive layer may be formed by a method such as coating or vapor deposition. Thereafter, the insulating layer, the semiconductor layer, and the conductive layer may be selectively patterned by a photolithography method. In this way, a semiconductor pattern, a conductive pattern, a signal line, and the like included in the circuit layer DP-CL and the light emitting element layer DP-OLED may be formed. The base layer SUB may be a base substrate supporting the circuit layer DP-CL and the light emitting element layer DP-OLED.

The base layer SUB may include a synthetic resin layer. The synthetic resin layer may include a thermosetting resin. The base layer SUB may have a multi-layer structure. For example, the base layer SUB may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. The silicon oxide layer and the amorphous silicon layer may be referred to as a base barrier layer.

The circuit layer DP-CL may be disposed on the base layer SUB. The circuit layer DP-CL may provide a signal for driving the light emitting element OLED included in the light emitting element layer DP-OLED. The circuit layer DP-CL may include a buffer layer BFL, a transistor T1, a first insulating layer 10, a second insulating layer 20, a third insulating layer 30, a fourth insulating layer 40, a fifth insulating layer 50, and a sixth insulating layer 60.

The buffer layer BFL may improve a bonding force between the base layer SUB and the semiconductor pattern. The buffer layer BFL may include a silicon oxide layer and a silicon nitride layer. The silicon oxide layer and the silicon nitride layer may be alternately stacked.

A semiconductor pattern may be disposed on the buffer layer BFL. The semiconductor pattern may include polysilicon. However, the embodiment of the present disclosure is not limited thereto, and the semiconductor pattern may include amorphous silicon or metal oxide.

FIG. 4 illustrates only some of the semiconductor patterns, and a semiconductor pattern may be further disposed in another area of the pixel PX on a plane. The semiconductor pattern may be arranged in a specific rule across the plurality of pixels PX. Semiconductor patterns may have different electrical properties depending on whether they are doped or not. The semiconductor pattern may include a first area having high conductivity and a second area having low conductivity. The first area may be doped with an N-type dopant or a P-type dopant. The P-type transistor may include a doped area doped with a P-type dopant, and the N-type transistor may include a doped area doped with an N-type dopant. The second area may be a non-doped area or may be doped with a lower concentration than the first area.

The conductivity of the first area is greater than that of the second area, and the first area may substantially serve as an electrode or a signal line. The second area may substantially correspond to the active (or channel) of the transistor. In other words, a portion of the semiconductor pattern may be an active transistor, another portion may be a source or drain of the transistor, and another portion may be a connection electrode or a connection signal line.

Each of the plurality of pixels PX (see FIG. 3) may have an equivalent circuit including seven transistors, one capacitor, and a light emitting element, and the equivalent circuit diagram of the pixel may be modified in various forms. FIG. 4 illustrates one transistor T1 and a light emitting element OLED included in each of the plurality of pixels PX (see FIG. 4A). The first transistor T1 may include a source S1, an active A1, a drain D1, and a gate G1.

The source S1, the active A1, and the drain D1 of the transistor T1 may be formed from a semiconductor pattern. The source S1 and the drain D1 may extend in opposite directions from the active A1 on a cross-section. FIG. 4 illustrates a part of a connection signal line SCL formed from a semiconductor pattern.

The first insulating layer 10 may be disposed on the buffer layer BFL. The first insulating layer 10 may overlap the plurality of pixels PX in common and cover the semiconductor pattern. The first insulating layer 10 may be an inorganic layer and/or an organic layer, and may have a single layer or multilayer structure. The first insulating layer 10 may include at least one of aluminum oxide, titanium oxide, silicon oxide silicon oxynitride, zirconium oxide, or hafnium oxide. In this embodiment, the first insulating layer 10 may be a single-layer silicon oxide layer. In addition to the first insulating layer 10, the insulating layer of the circuit layer DP-CL to be described later may be an inorganic layer and/or an organic layer, and may have a single layer or multilayer structure. The inorganic layer may include at least one of the above-mentioned materials.

A gate G1 may be disposed on the first insulating layer 10. The gate G1 may be a part of the metal pattern. The gate G1 may overlap the active A1. In the process of doping the semiconductor pattern, the gate G1 may be the same as a mask.

The second insulating layer 20 may be disposed on the first insulating layer 10. The second insulating layer 20 may cover the gate G1. The second insulating layer 20 may overlap the plurality of pixels PX in common. The second insulating layer 20 may be an inorganic layer and/or an organic layer, and may have a single layer or multilayer structure. In this embodiment, the second insulating layer 20 may be a single-layer silicon oxide layer.

The upper electrode UE may be disposed on the second insulating layer 20. The upper electrode UE may overlap the gate G1 and the active A1. The upper electrode UE may be a part of the metal pattern. A portion of the gate G1 and the upper electrode UE overlapping the portion may define a capacitor. However, this is an example and the upper electrode UE according to an embodiment of the present disclosure may be omitted.

The third insulating layer 30 may be disposed on the second insulating layer 20. The third insulating layer 30 may cover the upper electrode UE. In this embodiment, the third insulating layer 30 may be a single-layer silicon oxide layer. A first connection electrode CNE1 may be disposed on the third insulating layer 30. The first connection electrode CNE1 may be connected to the connection signal line SCL which is disposed on the buffer layer BFL through a contact hole CNT-1 penetrating the first to third insulating layers 10, 20, and 30.

The fourth insulating layer 40 may be disposed on the third insulating layer 30. The fourth insulating layer 40 may cover the first connection electrode CNE1. The fourth insulating layer 40 may be a single layer of silicon oxide.

The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 penetrating the fourth insulating layer 40 and the fifth insulating layer 50.

The sixth insulating layer 60 may be disposed on the fifth insulating layer 50. The sixth insulating layer 60 may cover the second connection electrode CNE2. The sixth insulating layer 60 may be an organic layer.

The light emitting element layer DP-OLED may include a first electrode AE, a pixel defining film PDL, and a light emitting element OLED. The light emitting element OLED may be electrically connected to the transistor T1. The light emitting element OLED may include a hole control layer HCL, a light emitting layer EML, an electron control layer ECL, and a second electrode CE.

The first electrode AE may be disposed on the sixth insulating layer 60. The first electrode AE may be connected to the second connection electrode CNE2 through a contact hole CNT-3 penetrating the sixth insulating layer 60.

An opening part OP may be defined in the pixel defining film PDL. The opening part OP of the pixel defining film PDL may expose at least a portion of the first electrode AE.

The active area DP-AA (see FIG. 3) may include an emission area PXA and a light blocking area NPXA adjacent to the emission area PXA. The light blocking area NPXA may surround the emission area PXA. In the present embodiment, the emission area PXA is defined to correspond to a partial area of the first electrode AE exposed by the opening part OP.

The hole control layer HCL may be commonly disposed in the emission area PXA and the light blocking area NPXA. The hole control layer HCL may include a hole transport layer and further include a hole injection layer. The light emitting layer EML may be disposed on the hole control layer HCL. The light emitting layer EML may be disposed in an area corresponding to the opening part OP. That is, the light emitting layer EML may be formed separately on each of the pixels.

The electron control layer ECL may be disposed over the light emitting layer EML. The electron control layer ECL includes an electron transport layer, and may further include an electron injection layer. The hole control layer HCL and the electron control layer ECL may be commonly formed in the plurality of pixels using an open mask. The second electrode CE may be disposed on the electron control layer ECL. The second electrode CE may have an integral shape. The second electrode CE may be commonly disposed in the plurality of pixels PX. The second electrode CE may be referred to as a common electrode.

The encapsulation layer TFL may be disposed on the light emitting element layer DP-OLED to cover the light emitting element layer DP-OLED. The encapsulation layer TFL may include a first inorganic layer LY1, an organic layer LY2, and a second inorganic layer LY3 sequentially stacked along the third direction DR3. However, this is an example and the encapsulation layer TFL according to an embodiment of the present disclosure is not limited thereto. For example, the encapsulation layer TFL according to an embodiment of the present disclosure may further include a plurality of inorganic layers and a plurality of organic layers.

The first inorganic layer LY1 may prevent external moisture or oxygen from penetrating into the light emitting element layer DP-OLED. For example, the first inorganic layer LY1 may include silicon nitride, silicon oxide, or a combination thereof.

The organic layer LY2 may be disposed on the first inorganic layer LY1 to provide a flat surface. A curve formed on the upper surface of the first inorganic layer LY1 or particles existing on the first inorganic layer LY1 may be covered by the organic layer LY2. For example, the organic layer LY2 may include an acryl-based organic layer, but is not limited thereto.

The second inorganic layer LY3 may be disposed on the organic layer LY2 to cover the organic layer LY2. The second inorganic layer LY3 may seal moisture emitted from the organic layer LY2 and prevent the moisture from being introduced to the outside. The second inorganic layer LY3 may include silicon nitride, silicon oxide, or a combination thereof.

Figure 5:
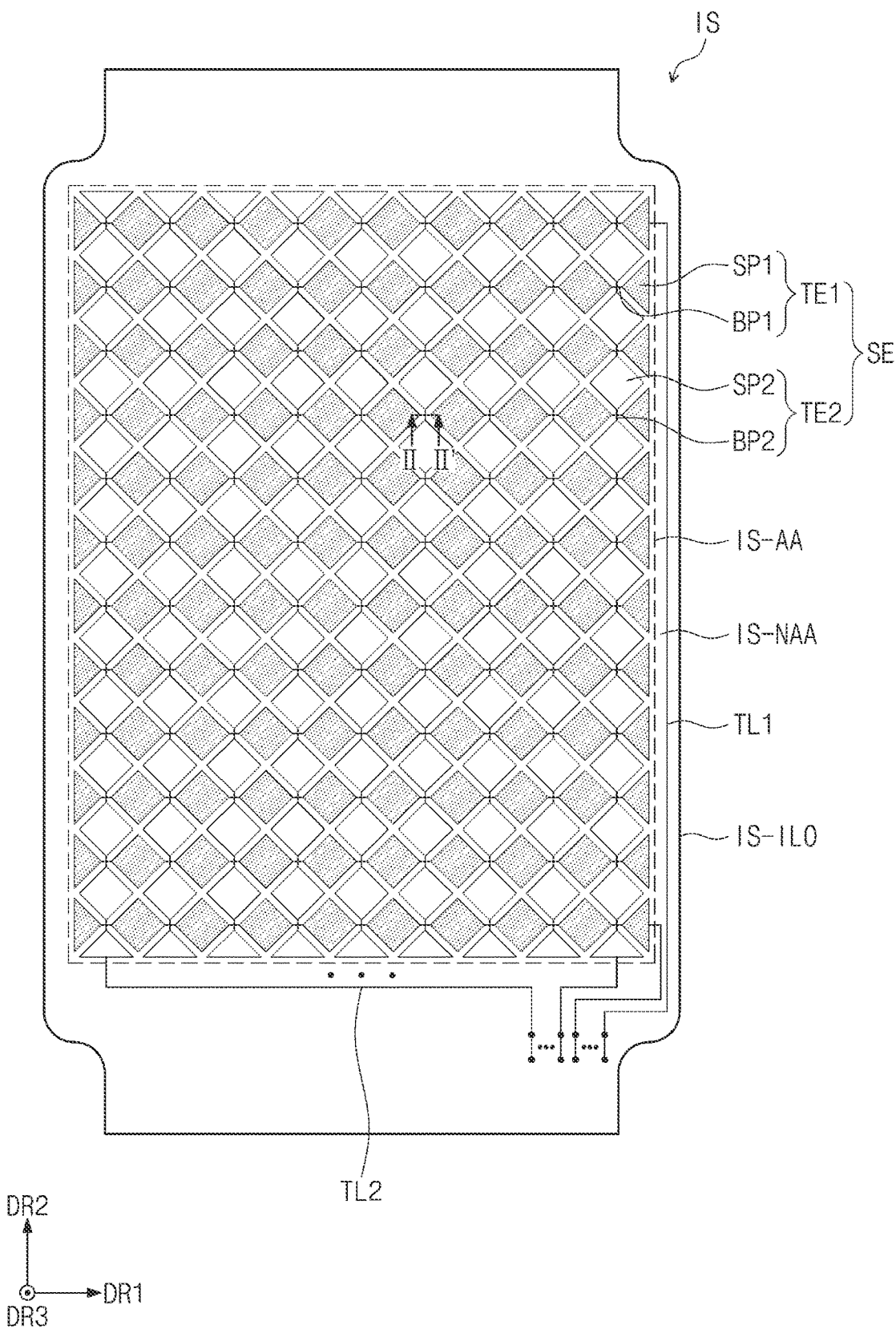
FIG. 5 is a plan view of a sensor layer according to an embodiment of the present disclosure.

FIG. 5 is a plan view of a sensor layer according to an embodiment of the present disclosure.

Referring to FIG. 5, an active area IS-AA and a peripheral area IS-NAA surrounding the active area IS-AA may be defined in the sensor layer IS. The active area IS-AA may be an area activated according to an electrical signal. For example, the active area IS-AA may be an area sensing an input. When viewed on a plane, the active area IS-AA may overlap the active area DP-AA (see FIG. 3) of the display layer DP (see FIG. 3), and the peripheral area IS-NAA may overlap the peripheral area DP-NAA (see FIG. 3) of the display layer DP (see FIG. 3).

The sensor layer IS may include a base insulating layer IS-IL0, a plurality of sensing electrodes SE, and a plurality of sensing lines TL1 and TL2. The plurality of sensing electrodes SE may be disposed in an active area IS-AA, and the plurality of sensing lines TL1 and TL2 may be disposed in a peripheral area IS-NAA.

The base insulating layer IS-IL0 may be an inorganic layer including any one of silicon nitride, silicon oxynitride, and silicon oxide. Alternatively, the base insulating layer IS-IL0 may be an organic layer including an epoxy resin, an acrylic resin, or an imide-based resin. The base insulating layer IS-IL0 may be directly formed on the display layer DP (see FIG. 3). Alternatively, the base insulating layer IS-IL0 may be coupled to the display layer DP (see FIG. 3) through an adhesive member.

The plurality of sensing electrodes SE may include a plurality of first sensing electrodes TE1 and a plurality of second sensing electrodes TE2. The sensor layer IS may acquire information about an external input through a change in capacitance between the plurality of first sensing electrodes TE1 and the plurality of second sensing electrodes TE2.

Each of the plurality of first sensing electrodes TE1 may extend along the first direction DR1, and the plurality of first sensing electrodes TE1 may be arranged along the second direction DR2. Each of the plurality of first sensing electrodes TE1 may include a plurality of sensing patterns SP1 and a plurality of bridge patterns BP1. Each of the plurality of bridge patterns BP1 may electrically connect two sensing patterns SP1 adjacent to each other. That is, the bridge pattern BP1 is disposed on two sensing patterns SP1 therebetween. The plurality of sensing patterns SP1 may have a mesh structure.

Each of the plurality of second sensing electrodes TE2 may extend along the second direction DR2, and the plurality of second sensing electrodes TE2 may be arranged along the first direction DR1. Each of the plurality of second sensing electrodes TE2 may include a plurality of first portions SP2 and a plurality of second portions BP2. Each of the plurality of second portions BP2 may electrically connect two adjacent first portions SP2 to each other. That is, the second portion BP2 is disposed on two first portions SP2 therebetween. The plurality of first portions SP2 and the plurality of second portions BP2 may have a mesh structure.

FIG. 5 shows as an example that one bridge pattern BP1 is connected to two sensing patterns SP1 adjacent to each other, but the connection relationship between the plurality of bridge patterns BP1 and the plurality of sensing patterns SP1 according to an embodiment of the present disclosure is not limited thereto. For example, two sensing patterns SP1 adjacent to each other may be connected by two bridge patterns BP1.

The plurality of bridge patterns BP1 may be disposed on a different layer from the plurality of second portions BP2. The plurality of bridge patterns BP1 may insulate and cross the plurality of second sensing electrodes TE2. For example, the plurality of bridge patterns BP1 may insulate and cross the plurality of second portions BP2, respectively.

The plurality of sensing lines TL1 and TL2 may include a plurality of first sensing lines TL1 and a plurality of second sensing lines TL2. The plurality of first sensing lines TL1 may be electrically connected to the plurality of first sensing electrodes TE1, respectively. The plurality of second sensing lines TL2 may be electrically connected to the plurality of second sensing electrodes TE2, respectively.

The plurality of first sensing pads TD1 (see FIG. 3) may be electrically connected to the plurality of first sensing lines TL1 through contact holes, respectively. The plurality of second sensing pads TD2 (see FIG. 3) may be electrically connected to the plurality of second sensing lines TL2 through contact holes, respectively.

Figure 6:
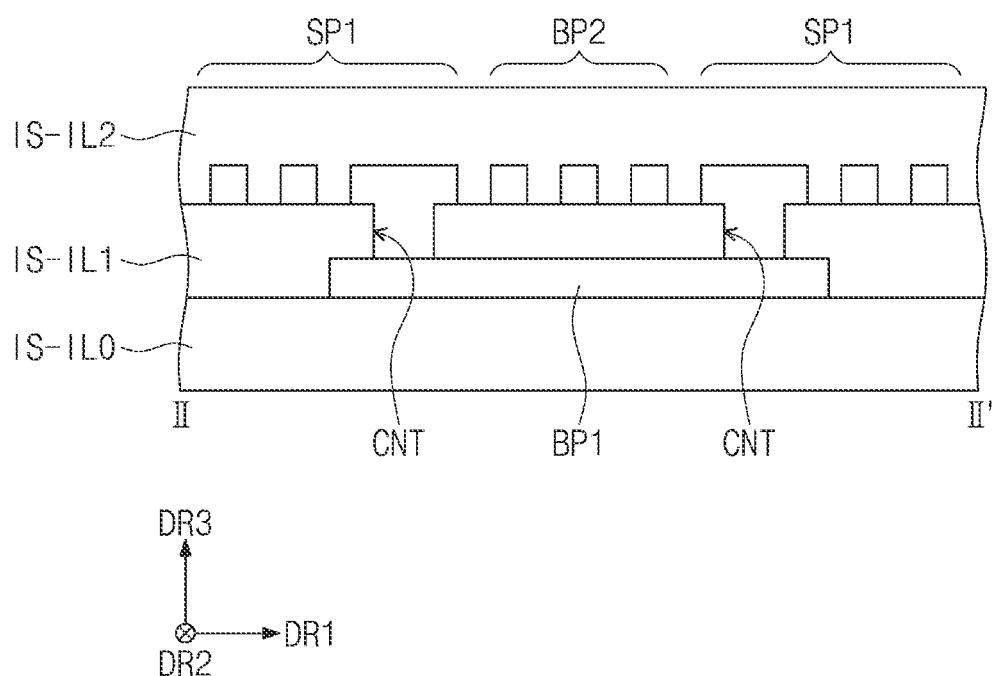
FIG. 6 is a cross-sectional view taken along II-II' of FIG. 5 according to an embodiment of the present disclosure.

FIG. 6 is a cross-sectional view taken along II-II' of FIG. 5 according to an embodiment of the present disclosure. In the description of FIG. 6, the same reference numerals are used for the components described with reference to FIG. 5, and a description thereof will be omitted.

Referring to FIGS. 5 and 6, a plurality of bridge patterns BP1 may be disposed on the base insulating layer IS-IL0. The first insulating layer IS-IL1 may be disposed on the plurality of bridge patterns BP1. The first insulating layer IS-IL1 may have a single-layered or multi-layered structure. The first insulating layer IS-IL1 may include an inorganic material, an organic material, or a composite material.

The plurality of sensing patterns SP1, the plurality of first portions SP2, and the plurality of second portions BP2 may be disposed on the first insulating layer IS-ILL The plurality of sensing patterns SP1, the plurality of first portions SP2, and the plurality of second portions BP2 may have a mesh structure.

The plurality of contact holes CNT may be formed by penetrating the first insulating layer IS-IL1 in the third direction DR3. Two adjacent sensing patterns SP1 among the plurality of sensing patterns SP1 may be electrically connected to the bridge pattern BP1 through the plurality of contact holes CNT.

The second insulating layer IS-IL2 may be disposed on the plurality of sensing patterns SP1, the plurality of first portions SP2, and the plurality of second portions BP2. The second insulating layer IS-IL2 may have a single-layer or multi-layer structure. The second insulating layer IS-IL2 may include an inorganic material, an organic material, or a composite material.

FIG. 6 illustrates a bottom bridge structure in which a plurality of bridge patterns BP1 are disposed under a plurality of sensing patterns SP1, a plurality of first portions SP2, and a plurality of second portions BP2, but the embodiment of the present disclosure is not limited thereto. For example, the sensor layer IS-1 may have a top bridge structure in which the plurality of bridge patterns BP1 are disposed on the plurality of sensing patterns SP1, the plurality of first portions SP2, and the plurality of second portions BP2.

Figure 7:
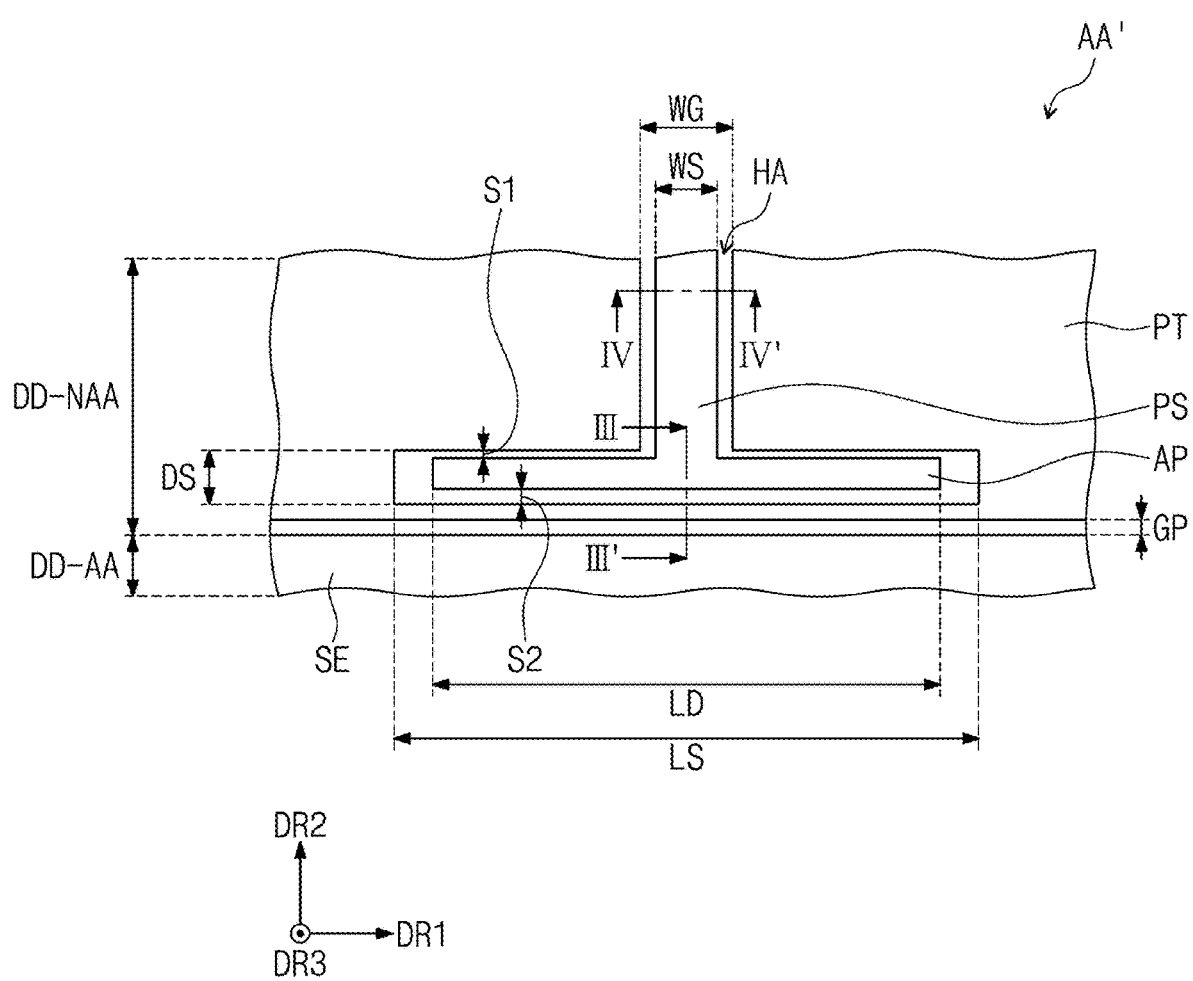
FIG. 7 is a plan view illustrating an area of an electronic device corresponding to AA' of FIG. 3 according to an embodiment of the present disclosure.

FIG. 7 is a plan view illustrating an area of an electronic device corresponding to AA' of FIG. 3 according to an embodiment of the present disclosure.

Referring to FIG. 7, an antenna pattern AP, a feeding part PS, and a ground electrode PT may be disposed in the peripheral area DD-NAA of the electronic device DD (see FIG. 1).

The antenna pattern AP may transmit/receive a signal at a preset first driving frequency. The antenna pattern AP may extend in the first direction DR1. The antenna pattern AP may have a first antenna width LD in the first direction DR1. The antenna width LD may be about 2.5 millimeter (mm) to about 3.5 mm. For example, the antenna width LD may be about 3 mm. When the antenna width LD is less than about 2.5 mm and greater than about 3.5 mm, the antenna pattern AP may not operate at the first driving frequency band. The first driving frequency may be about 27 gigahertz (GHz) to about 37 GHz. For example, the first driving frequency may be about 28 GHz. The antenna pattern AP may include a conductive material. The conductive material may include a metal.

Unlike the present disclosure, the antenna pattern may be formed of a metal having a mesh structure or a transparent metal such as Indium-Tin-Oxide (ITO). In the case of having the mesh structure, the sheet resistance of the antenna pattern may be relatively increased by the mesh structure having a plurality of openings. In addition, when the transparent metal is included, the conductivity of the antenna pattern may be relatively low. When the sheet resistance of the antenna pattern is high or conductivity is low, antenna radiation efficiency and gain may be reduced. However, according to the present disclosure, the antenna pattern AP may be provided as an integrally provided metal. Sheet resistance of the antenna pattern AP may be lowered, and conductivity thereof may be increased. Accordingly, it is possible to provide an antenna pattern AP having improved antenna radiation efficiency and antenna gain.

The feeding part PS may extend in the second direction DR2. The feeding part PS may have a feeding width WS in the first direction DR1. The feeding width WS may be about 0.4 mm to about 0.5 mm. For example, the feeding width WS may be about 0.45 mm. When the feeding width WS is less than about 0.4 mm and more than about 0.5 mm, since impedance matching is not performed with the antenna pattern AP, it may not be easy to feed a signal to the antenna pattern AP.

The feeding part PS may be provided integrally with the antenna pattern AP. The feeding part PS may be provided with the same material as the antenna pattern AP. The feeding part PS may include a conductive material. For example, the conductive material may include a metal.

The ground electrode PT may surround the antenna pattern AP and the feeding part PS. A ground voltage may be provided to the ground electrode PT. A slot HA surrounding the antenna pattern AP and the feeding part PS may be defined between the ground electrode PT and the antenna pattern AP and the feeding part PS.

The slot HA surrounding the antenna pattern AP may have a first width LS extending in the first direction DR1. The first width LS may be about 3 mm to about 4 mm. For example, the first width LS may be about 3.4 mm. The slot HA surrounding the antenna pattern AP may have a second width DS extending in the second direction DR2. The second width DS may be about 0.3 mm to about 0.4 mm. For example, the second width DS may be about 0.35 mm.

The third width S1 of the slot HA formed in the second direction DR2 between the antenna pattern AP and the ground electrode PT may be about 0.04 mm to about 0.06 mm. For example, the third width S1 may be about 0.05 mm. At the portion adjacent to the sensing electrode SE between the antenna pattern AP and the ground electrode PT, the fourth width S2 of the slot HA formed in the second direction DR2 may be about 0.05 mm to about 0.15 mm. For example, the fourth width S2 may be about 0.1 mm.

The slot HA surrounding the feeding part PS may have a fifth width WG extending in the first direction DR1. The fifth width WG may be about 0.25 mm to about 0.75 mm. For example, the fifth width WG may be about 0.53 mm.

When viewed on a plane, the sensing electrode SE may not overlap the antenna pattern AP, the feeding part PS, and the ground electrode PT.

Each of the antenna pattern AP, the feeding part PS, and the ground electrode PT may be spaced apart from the sensing electrode SE in the second direction DR2. When viewed on a plane, the ground electrode PT may be spaced apart from the sensing electrode SE by the first gap GP in the second direction DR2. The first gap GP may act as a capacitance between the antenna pattern AP, the feeding part PS, and the ground electrode PT and the sensing electrode SE.

The signal provided to the sensing electrode SE may operate at the second driving frequency. The antenna pattern AP may operate at the first driving frequency. The second driving frequency may be lower than the first driving frequency. For example, the second driving frequency may be about 240 kilohertz (kHz).

From the perspective of the sensing electrode SE, since the antenna pattern AP, the feeding part PS, and the ground electrode PT are operated at a relatively high driving frequency, an open circuit may be operated between the sensing electrode SE, the antenna pattern AP, the feeding part PS, and the ground electrode PT. That is, the touch signal provided to the sensing electrode SE may not be provided to the ground electrode PT to which the ground voltage is provided. Accordingly, the electronic device DD (see FIG. 1) with improved touch sensing performance may be provided.

From the perspective of the antenna pattern AP, the feeding part PS, and the ground electrode PT, since the sensing electrode SE operates at a relatively low driving frequency, a short circuit may be operated between the antenna pattern AP, the feeding part PS, and the ground electrode PT and the sensing electrode SE. That is, the antenna pattern AP may utilize the sensing electrode SE as a floating ground electrode. Accordingly, it is possible to provide the electronic device DD (see FIG. 1) having improved frequency signal emission performance.

Figure 8:
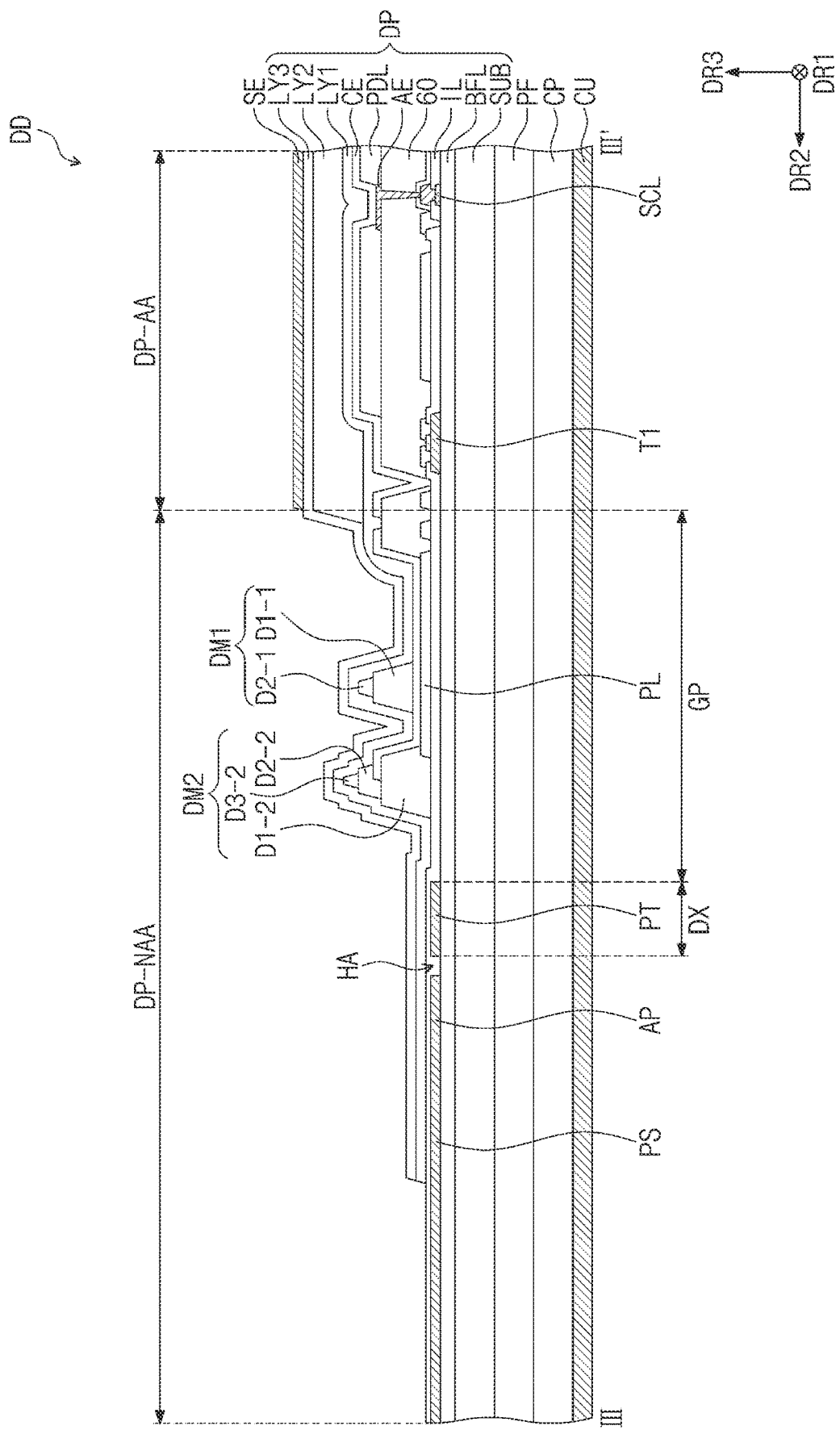
FIG. 8 is a cross-sectional view taken along line III-III' of FIG. 7 according to an embodiment of the present disclosure.

FIG. 8 is a cross-sectional view taken along line III-III' of FIG. 7 according to an embodiment of the present disclosure. In the description of FIG. 8, the same reference numerals are used for the components described with reference to FIG. 4, and a description thereof will be omitted.

Referring to FIGS. 7 and 8, in the electronic device DD, a cover layer CU, a lower member layer CP, a protective layer PF, and a display layer DP may be sequentially stacked along the third direction DR3.

The display layer DP may include a base layer SUB, a buffer layer BFL, a plurality of insulating layers IL, and a sixth insulating layer 60.

The transistor T1 may be disposed on the buffer layer BFL. The transistor T1 may be electrically connected to the light emitting element OLED (see FIG. 4). The transistor T1 may be disposed in the active area DP-AA.

The plurality of insulating layers IL may be disposed on the buffer layer BFL. The plurality of insulating layers IL may include the first insulating layer 10 (see FIG. 4), the second insulating layer 20 (see FIG. 4), the third insulating layer 30 (see FIG. 4), the fourth insulating layer 40 (see FIG. 4), and the fifth insulating layer 50 (see FIG. 4).

The first protruding part DM1 and the second protruding part DM2 may be disposed on the plurality of insulating layers IL. The first protruding part DM1 and the second protruding part DM2 may be disposed to be spaced apart from each other in the second direction DR2. The first protruding part DM1 may be referred to as a first dam. The second protruding part DM2 may be referred to as a second dam.

When the organic monomer is printed to form the organic layer LY2, the first protruding part DM1 and the second protruding part DM2 may prevent the organic monomer from overflowing.

Each of the first protruding part DM1 and the second protruding part DM2 may have a plurality of stacked structures. For example, the first protruding part DM1 may include a first protruding portion D1-1 disposed on the power wire PL and a second protruding portion D1-2 disposed on the first protruding portion D1-1. The second protruding part DM2 may include a first protruding portion D2-1 disposed on the plurality of insulating layers IL, a second protruding portion D2-2 disposed on the first protruding portion D2-1, and a third protruding portion D3-2 disposed on the second protruding portion D2-2.

The antenna pattern AP, the feeding part PS, and the ground electrode PT may be disposed on the buffer layer BFL. However, this is an example and the arrangement relationship of the antenna pattern AP, the feeding part PS, and the ground electrode PT according to an embodiment of the present disclosure is not limited thereto. For example, the antenna pattern AP, the feeding part PS, and the ground electrode PT may be disposed between the plurality of insulating layers IL. The antenna pattern AP, the feeding part PS, and the ground electrode PT may be disposed in the peripheral area DP-NAA. A plurality of antenna patterns AP disposed in the peripheral area DP-NAA may be provided.

A portion of the antenna pattern AP, the feeding part PS, the ground electrode PT, and the transistor T1 may be disposed on the same layer. For example, the antenna pattern AP, the feeding part PS, and the ground electrode PT may be disposed on the same layer as the source S1 (see FIG. 4), the active A1 (see FIG. 4), and the drain D1 (see FIG. 4), or may be disposed on the same layer as the gate G1 (see FIG. 4). The antenna pattern AP, the feeding part PS, the ground electrode PT, and the transistor T1 may be formed by the same process. A portion of the antenna pattern AP, the feeding part PS, the ground electrode PT, and the transistor T1 may include the same material.

According to the present disclosure, the antenna pattern AP for transmitting, receiving, or transmitting and receiving a plurality of wireless communication signals, for example, a plurality of radio frequency signals may be disposed in the peripheral area DP-NAA. However, in another embodiment, the electronic device DD may not need a separate antenna film. For example, the antenna pattern AP may be integrally formed on the same layer as a portion of the transistor T1 in the display layer DP. Accordingly, the thickness of the electronic device DD may be reduced.

Also, according to the present disclosure, the antenna pattern AP may be disposed in the peripheral area DP-NAA. When viewed on a plane, the active area DD-AA (see FIG. 1) displaying an image may not overlap the antenna pattern AP. The quality of the image displayed by the display layer DP may be prevented from being deteriorated by the antenna pattern AP. Accordingly, the electronic device DD having improved display quality may be provided.

The cover layer CU may overlap the antenna pattern AP, the feeding part PS, and the ground electrode PT. The cover layer CU may act as a ground electrode with respect to the antenna pattern AP.

The antenna pattern AP, the feeding part PS, and the ground electrode PT may be spaced apart from the sensing electrode SE.

The sensing electrode SE may not overlap the antenna pattern AP, the feeding part PS, and the ground electrode PT. The sensing electrode SE may be spaced apart from the antenna pattern AP in the second direction DR2. The sensing electrode SE and the ground electrode PT may be spaced apart from each other by the first gap GP in the second direction DR2.

According to the present disclosure, the sensing electrode SE may overlap the active area DP-AA, and the antenna pattern AP may be disposed in the peripheral area DP-NAA. When viewed on a plane, the active area IS-AA (see FIG. 5) for sensing a touch may not overlap the antenna pattern AP. Degradation of the touch sensing performance sensed by the sensor layer IS (see FIG. 5) by the antenna pattern AP may be prevented. Accordingly, the electronic device DD having improved touch sensing performance may be provided.

Figure 9:
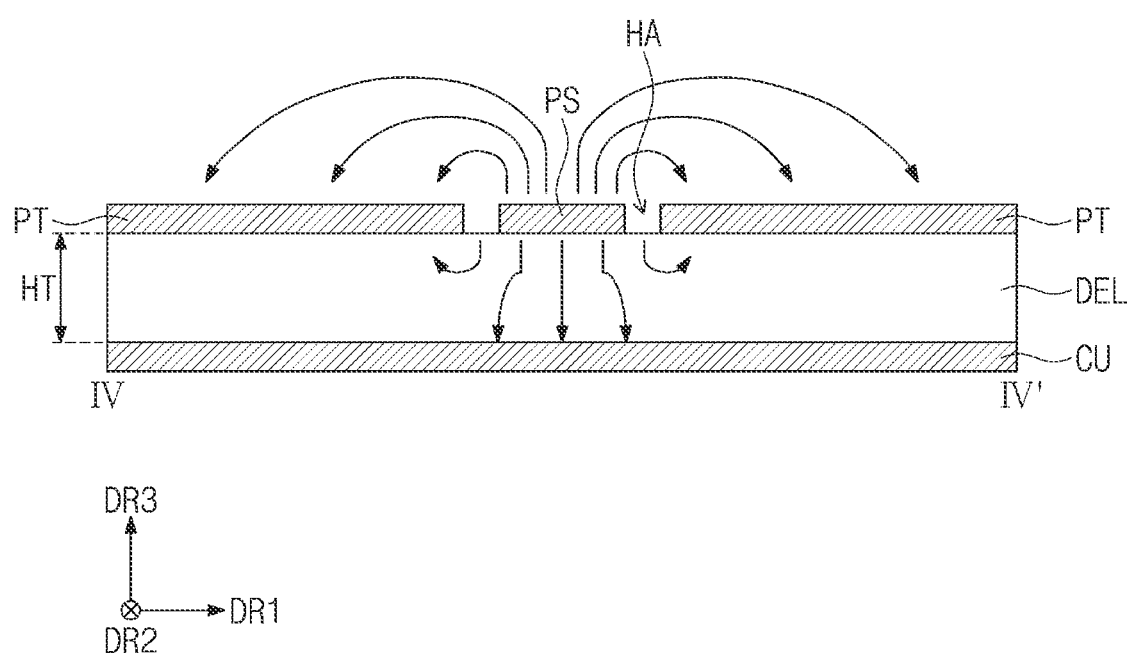
FIG. 9 is a cross-sectional view taken along line IV-IV' of FIG. 7 according to an embodiment of the present disclosure.

FIG. 9 is a cross-sectional view taken along line IV-IV' of FIG. 7 according to an embodiment of the present disclosure. In the description of FIG. 9, the same reference numerals are used for the components described with reference to FIGS. 7 and 8, and a description thereof will be omitted. In FIG. 9, the electric field distribution in the coplanar waveguide is indicated by arrows.

Referring to FIG. 9, the feeding part PS may include a coplanar waveguide.

A signal may be provided to the antenna pattern AP (see FIG. 7) through the feeding part PS. A slot HA may be defined between the feeding part PS and the ground electrode PT. The ground electrodes PT may be spaced apart from each other with the slot HA therebetween. A ground voltage may be provided to the ground electrode PT.

The insulating layer DEL may be disposed under the feeding part PS and the ground electrode PT. The insulating layer DEL may include a base layer SUB, a protective layer PF, and a lower member layer CP (not shown in FIG. 9). The thickness HT of the insulating layer DEL may be about 100 micrometer (μm) to about 200 μm.

The cover layer CU may be spaced apart from the feeding part PS and the ground electrode PT with respect to the insulating layer DEL therebetween. A ground voltage may be provided to the cover layer CU. The cover layer CU may operate as a ground of the antenna pattern AP (see FIG. 7).

In the upper portion of the insulating layer DEL, an electric field may be distributed in a direction from the feeding part PS toward the ground electrodes PT on both sides. In addition, an electric field may be distributed in a direction from the feeding part PS toward the cover layer CU inside the insulating layer DEL. At this time, the electric field inside the insulating layer DEL is not leaked to the outside by the cover layer CU. The coplanar waveguide has a structure in which the electric field is completely separated by the cover layer CU, and an upper area and a lower area with respect to the cover layer CU may not cause electromagnetic interference with each other. Through the coplanar waveguide, the feeding part PS may easily transmit a signal to the antenna pattern AP (see FIG. 7).

Figure 10:
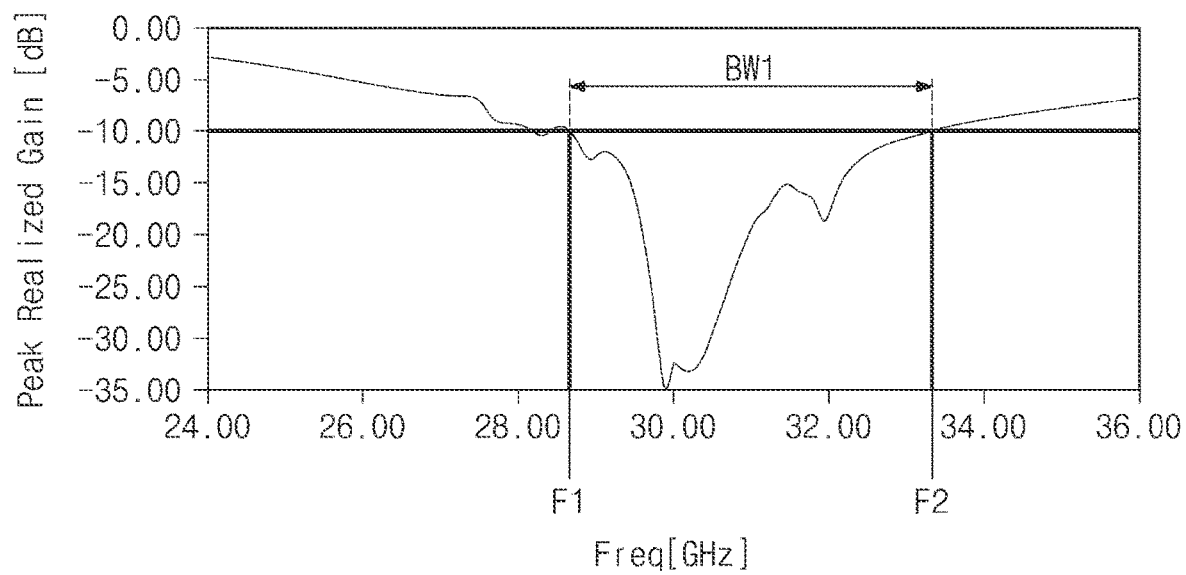
FIG. 10 is a graph illustrating S-parameters according to frequency according to an embodiment of the present disclosure.
Figure 11:
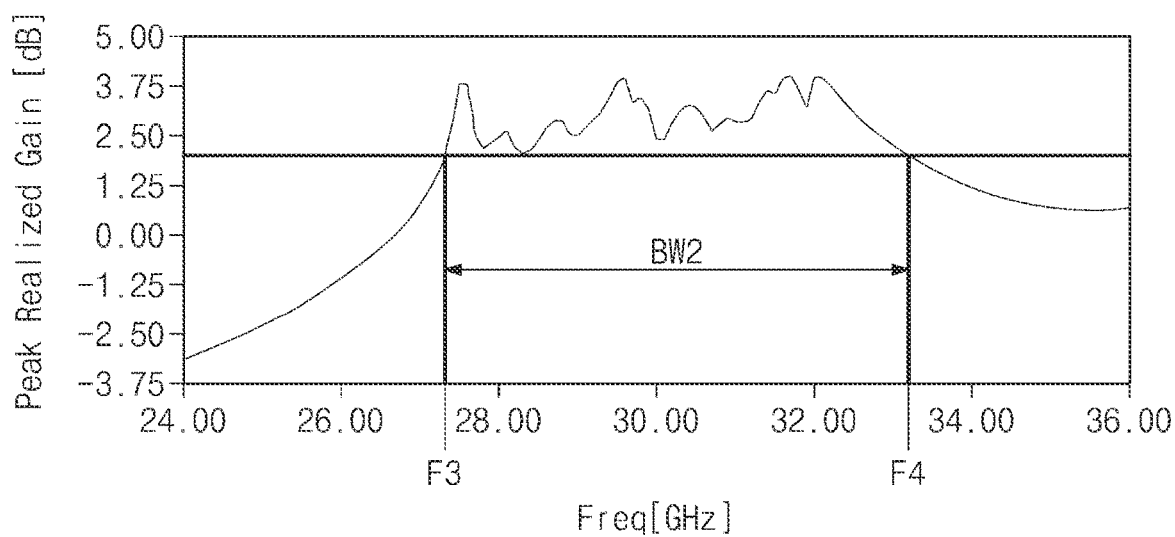
FIG. 11 is a graph illustrating a total gain according to a frequency of an antenna pattern according to an embodiment of the present disclosure.

FIG. 10 is a graph showing S-parameters according to frequency according to an embodiment of the present disclosure, and FIG. 11 is a graph illustrating a total gain according to a frequency of an antenna pattern according to an embodiment of the present disclosure.

Referring to FIGS. 7, 10, and 11, the antenna pattern AP may be designed to transmit, receive, or transmit/receive signals having frequency bands BW1 and BW2.

S11 may be one of S-parameters. S11 may be a value representing a ratio of a magnitude of a signal that is reflected back of an input signal to a magnitude of the input signal. For example, the input signal may be a signal provided through a feeding part PS. For example, S11 may be a reflection coefficient of the antenna pattern AP. When determining the operation of the antenna pattern AP, it may be determined based on the case where the S11 value is −10 decibel (dB). −10 dB may be a case in which the input signal is reflected and the magnitude of the returned signal is 10% of that of the input signal. When S11 is less than −10 dB, it may be determined that the antenna pattern AP operates in a corresponding frequency band.

The antenna pattern AP may operate between F1 to F2. F1 may be about 28.66 GHz. F2 may be about 33.33 GHz. That is, the antenna pattern AP may operate in the first frequency band BW1.

The antenna pattern AP may operate between F3 to F4. F3 may be about 27.32 GHz. F4 may be about 33.19 GHz. That is, the antenna pattern AP may operate in the second frequency band BW2. Referring to the total gain of the antenna pattern AP, the maximum gain may be about 4 dBi. In this case, a frequency range in which the gain to the maximum gain is dropped by 2 dB may be referred to as a 2 dB gain bandwidth. The 2 dB gain bandwidth of the antenna pattern AP may be referred to as a second frequency band BW2. For example, the second frequency band BW2 may be about 5.87 GHz.

The antenna pattern AP may radiate a signal in the third direction DR3.

According to the present disclosure, the frequency bands BW1 and BW2 operating in the antenna pattern AP may be broadband. Accordingly, the electronic device DD having an improved frequency bandwidth may be provided.

Figure 12:
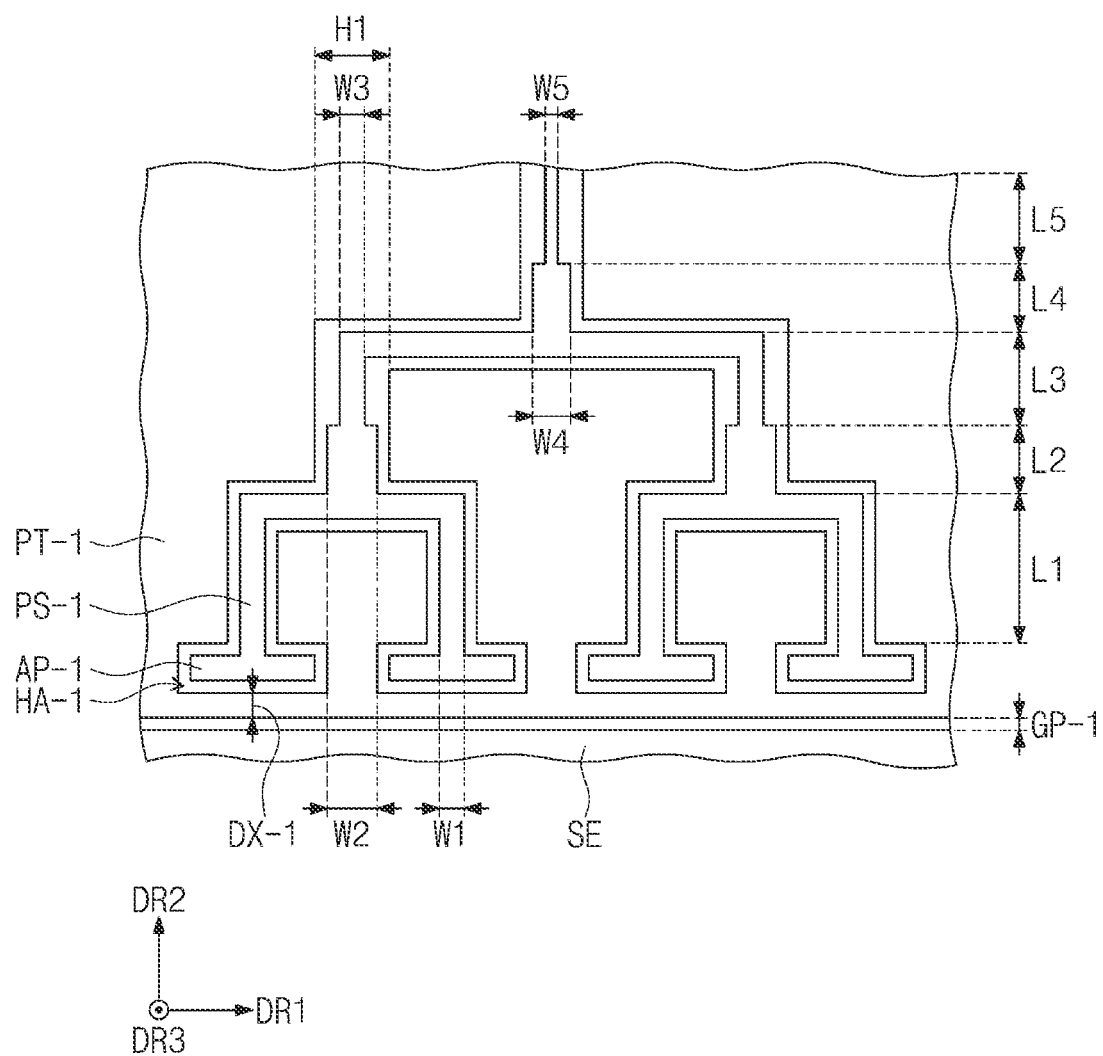
FIG. 12 is a plan view illustrating a part of an electronic device according to an embodiment of the present disclosure.

FIG. 12 is a plan view illustrating a part of an electronic device according to an embodiment of the present disclosure.

Referring to FIG. 12, a plurality of antenna patterns AP-1 may be provided.

Each of the plurality of antenna patterns AP-1 may be spaced apart from each other in the first direction DR1. The plurality of antenna patterns AP-1 may be spaced apart from the feeding part PS-1 in the second direction DR2.

The feeding part PS-1 may be provided integrally with the plurality of antenna patterns AP-1.

The ground electrode PT-1 may be disposed adjacent to the plurality of antenna patterns AP-1 and the feeding part PS-1. A slot HA-1 may be defined between the plurality of antenna patterns AP-1 and the feeding part PS-1 and the ground electrode PT-1. The slot HA-1 may surround the plurality of antenna patterns AP-1 and the feeding part PS-1.

The sensing electrode SE may be spaced apart from the plurality of antenna patterns AP-1, the feeding part PS-1, and the ground electrode PT-1 by the second gap GP-1 in the second direction DR2. The second gap GP-1 may be about 2.5 μm to about 3.5 μm. For example, the second gap GP-1 may be about 3 μm.

The distance DX-1 in the second direction DR2 from the second gap GP-1 to the slot HA-1 may be about 0.1 mm to about 0.5 mm.

A portion of the feeding part PS-1 extending from each of the plurality of antenna patterns AP-1 in the second direction DR2 may have a first width W1 in the first direction DR1. The first width W1 may be about 320 μm. The feeding part PS-1 having the first width W1 may have a first length L1 in the second direction DR2. The first length L1 may be about 5 mm.

A portion of the feeding part PS-1 connecting the two antenna patterns AP-1 may have a second width W2 in the first direction DR1. The second width W2 may be greater than the first width W1. The first width W1 may be about 450 μm. The feeding part PS-1 having the second width W2 may have a second length L2 in the second direction DR2. The second length L2 may be about 2 mm.

A portion of the feeding part PS-1 extending in the second direction DR2 from a portion of the feeding part PS-1 having the second width W2 may have a third width W3. The third width W3 may be less than the second width W2. The third width W3 may be the same as the first width W1. The feeding part PS-1 having the third width W3 may have a third length L3 in the second direction DR2. The third length L3 may be about 7 mm.

A portion connecting portions of the feeding part PS-1 having a third width W3 and extending in the second direction DR2 may have a fourth width W4 in the first direction DR1. The fourth width W4 may be greater than the third width W3. The fourth width W4 may be about 500 μm. The feeding part PS-1 having the fourth width W4 may have a fourth length L4 in the second direction DR2. The fourth length L4 may be about 2 mm.

A portion of the feeding part PS-2 extending in the second direction DR2 from a portion of the feeding part PS-1 having the fourth width W4 may have a fifth width W5. The fifth width W5 may be less than the fourth width W4. The fifth width W5 may be about 75 μm. The feeding part PS-1 having the fifth width W5 may have a fifth length L5 in the second direction DR2. The fifth length L5 may be about 5.6 mm.

The slot HA-1 may have a first slot width H1 in the first direction DR1. The first slot width H1 may be about 530 μm.

The feeding part PS-1 may be electrically connected to the driving chip IC (see FIG. 3).

The driving chip IC (see FIG. 3) may provide a signal to the plurality of antenna patterns AP-1 through the feeding part PS-1. For example, the driving chip IC (see FIG. 3) may control the beam steering of the plurality of antenna patterns AP-1 by adjusting the power supplied to each of the plurality of antenna patterns AP-1, and focus a frequency signal in a specific direction to enhance energy. In addition, a desired radiation pattern may be formed, so that radiation efficiency may be improved.

Figure 13:
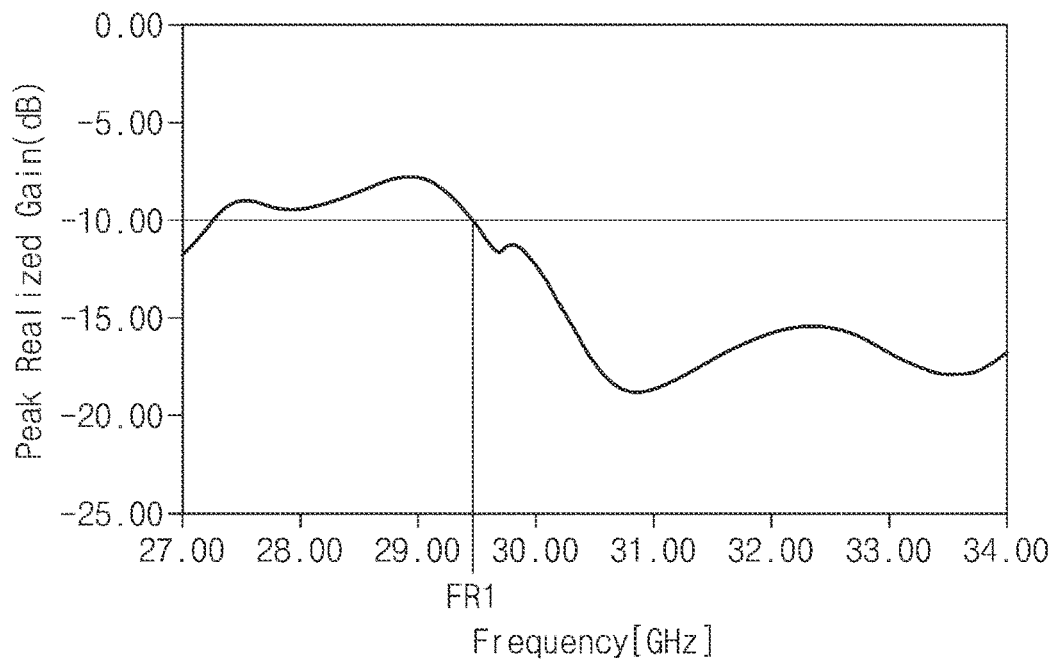
FIG. 13 is a graph illustrating S-parameters according to frequency according to an embodiment of the present disclosure.
Figure 14:
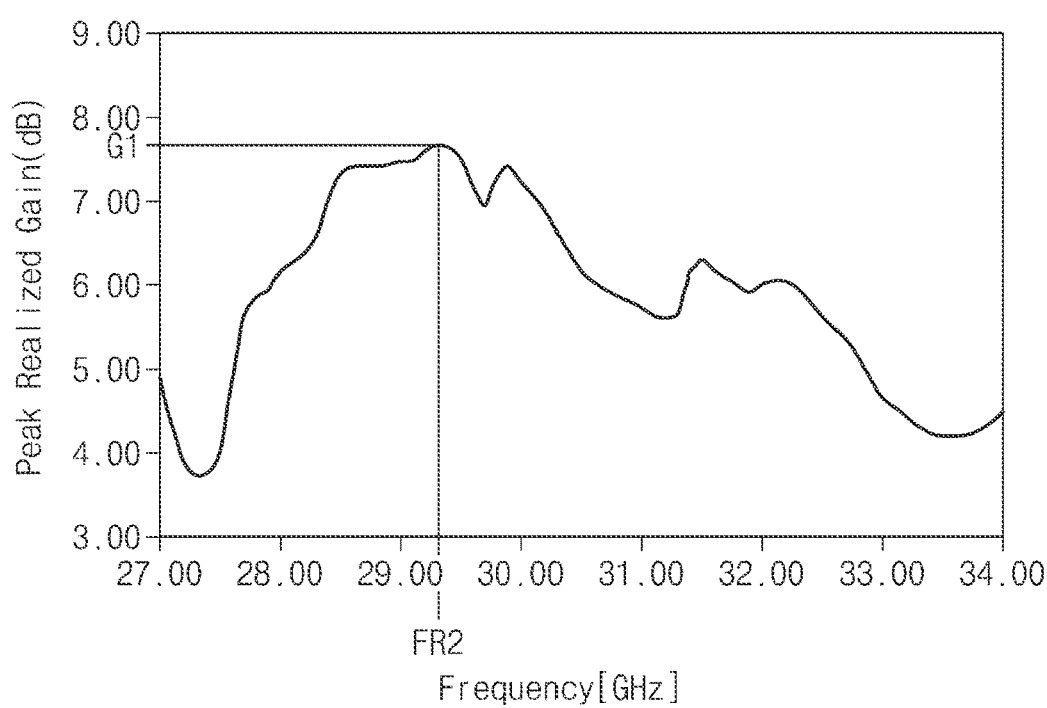
FIG. 14 is a graph illustrating a total gain according to a frequency of an antenna pattern according to an embodiment of the present disclosure.

FIG. 13 is a graph showing S-parameters according to frequency according to an embodiment of the present disclosure, and FIG. 14 is a graph illustrating a total gain according to a frequency of an antenna pattern according to an embodiment of the present disclosure.

Referring to FIGS. 12, 13, and 14, the plurality of antenna patterns AP-1 may be designed to transmit, receive, or transmit/receive a signal having a frequency band.

S11 may be one of S-parameters. S11 may be a value representing a ratio of a magnitude of a signal that is reflected back of an input signal to a magnitude of the input signal. For example, the input signal may be a signal provided through a feeding part PS. For example, S11 may be a reflection coefficient of the antenna pattern AP. When determining the operation of the antenna pattern AP, it may be determined based on the case where the S11 value is −10 decibel (dB). −10 dB may be a case in which the input signal is reflected and the magnitude of the returned signal is 10% of that of the input signal. When S11 is less than −10 dB, it may be determined that the antenna pattern AP operates in a corresponding frequency band. The plurality of antenna patterns AP-1 may operate at a first frequency FR1 or higher. The first frequency FR1 may be a frequency band for 5th generation (5G) communication.

When the distance DX-1 is about 100 μm and the second gap GP-1 is about 3 μm, the plurality of antenna patterns AP-1 may have a first value G1 at the second frequency FR2. The first value G1 may be the maximum gain of the plurality of antenna patterns AP-1. The second frequency FR2 may be about 29.3 GHz, and the first value G1 may be about 7.7 dBi. In this case, the 2 dB gain bandwidth may be about 4.7 GHz.

TABLE 1

| Second gap (GP-1)(um) | Distance (DX-1)(mm) | First value (G1)(dBi) |
|---|---|---|
| 3 | 0.1 | 7.67 |
|   | 0.2 | 7.83 |
|   | 0.3 | 8.06 |
|   | 0.4 | 8.12 |
|   | 0.5 | 8.20 |

Referring to Table 1, the distance DX-1 may be different depending on the design of the electronic device DD (see FIG. 1). When the distance DX-1 is about 0.1 mm, the first value G1 may be about 7.67 dBi. When the distance DX-1 is about 0.2 mm, the first value G1 may be about 7.83 dBi. When the distance DX-1 is about 0.3 mm, the first value G1 may be about 8.06 dBi. When the distance DX-1 is about 0.4 mm, the first value G1 may be about 8.12 dBi. When the distance DX-1 is about 0.5 mm, the first value G1 may be about 8.20 dBi. Regardless of the design of the electronic device DD (see FIG. 1) according to an embodiment of the present disclosure, the plurality of antenna patterns AP-1 may have a sufficient maximum gain. Accordingly, it is possible to provide the electronic device DD (see FIG. 1) having improved frequency signal emission performance.

Figure 15:
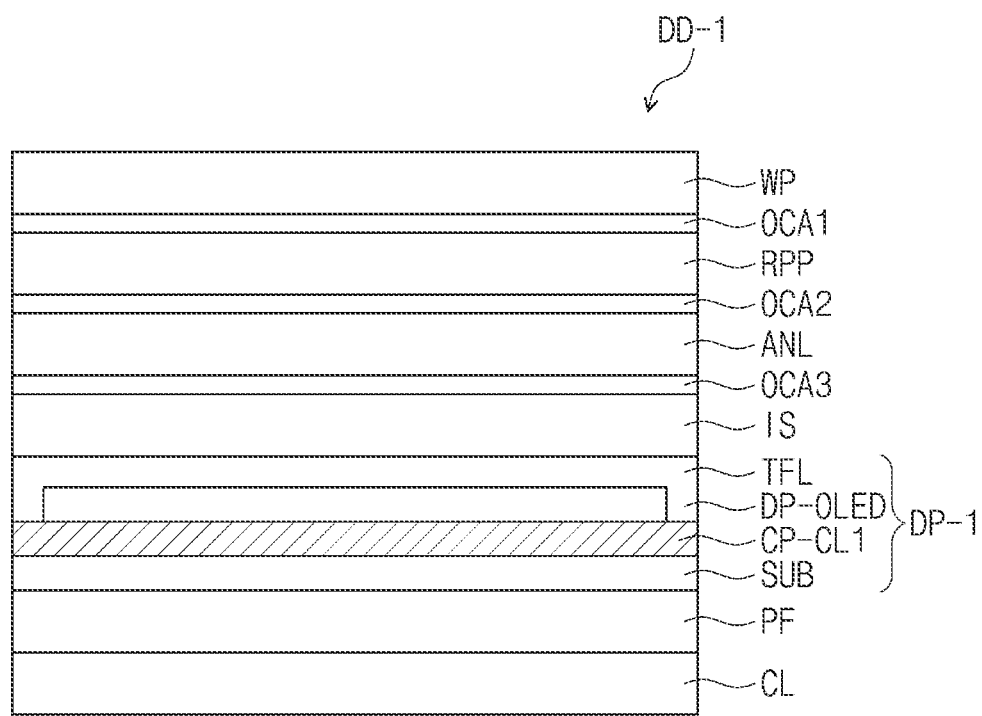
FIG. 15 is a schematic cross-sectional view of an electronic device according to an embodiment of the present disclosure.

FIG. 15 is a schematic cross-sectional view of an electronic device according to an embodiment of the present disclosure. In the description of FIG. 15, the same reference numerals are used for the components described with reference to FIG. 2, and a description thereof will be omitted.

Figure 16:
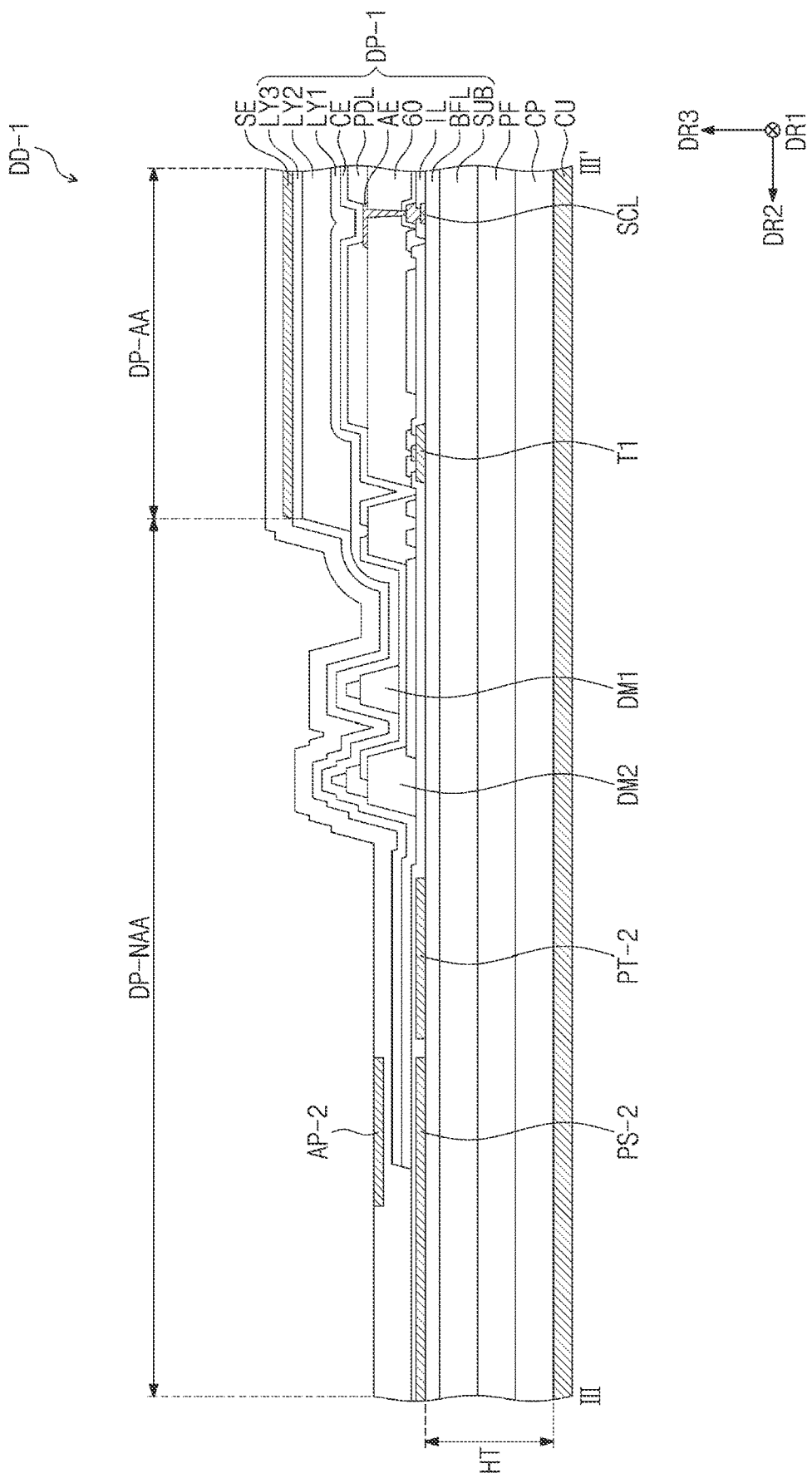
FIG. 16 is a cross-sectional view of a portion of an electronic device according to an embodiment of the present disclosure.

FIG. 16 is a cross-sectional view of a portion of an electronic device according to an embodiment of the present disclosure. In the description of FIG. 16, the same reference numerals are used for the components described with reference to FIG. 8, and a description thereof will be omitted.

Referring to FIGS. 15 and 16, the electronic device DD-1 may include an antenna layer ANL disposed on the display layer DP-1.

The antenna layer ANL may transmit, receive, or transmit/receive a wireless communication signal, for example, a radio frequency signal. The antenna layer ANL may include an antenna pattern AP-2. The antenna pattern AP-2 may overlap the peripheral area DP-NAA. The plurality of antennas may transmit, receive, or transmit/receive the same frequency band, or may transmit, receive, or transmit/receive different frequency bands.

The circuit layer CP-CL1 (see FIG. 15) may include a feeding part PS-2 and a ground electrode PT-2 (see FIG. 16). The feeding part PS-2 and the ground electrode PT-2 may be disposed in the peripheral area DP-NAA.

When viewed on a plane, the antenna pattern AP-2, the feeding part PS-2, and the cover layer CU may overlap each other.

The antenna pattern AP-2 may be electrically connected to the driving chip IC (see FIG. 3) through the feeding part PS-2. The antenna pattern AP-2 may be indirectly fed through a feeding part PS-2 to operate at a specific frequency. The indirect feeding may mean that a signal is transmitted without a configuration directly connected to the antenna pattern AP-2.

The feeding part PS-2 may include a coplanar waveguide. A signal may be provided to the antenna pattern AP-2 through the feeding part PS-2.

According to the present disclosure, when viewed on a plane, the antenna pattern AP-2 may overlap the peripheral area DP-NAA. The active area DD-AA (see FIG. 1) displaying an image may not overlap the antenna pattern AP-2. The quality of the image displayed by the display layer DP-1 (see FIG. 15) may be prevented from being deteriorated by the antenna pattern AP-2. Accordingly, the electronic device DD-1 (see FIG. 15) with improved display quality may be provided.

Also, according to the present disclosure, when viewed on a plane, the sensing electrode SE may overlap the active area DP-AA, and the antenna pattern AP may not overlap the peripheral area DP-NAA. The active area IS-AA (see FIG. 5) for sensing a touch may not overlap the antenna pattern AP-2. Degradation of the touch sensing performance sensed by the sensing electrode SE by the antenna pattern AP-2 may be prevented. Accordingly, the electronic device DD-1 (see FIG. 15) having improved touch sensing performance may be provided.

Figure 17:
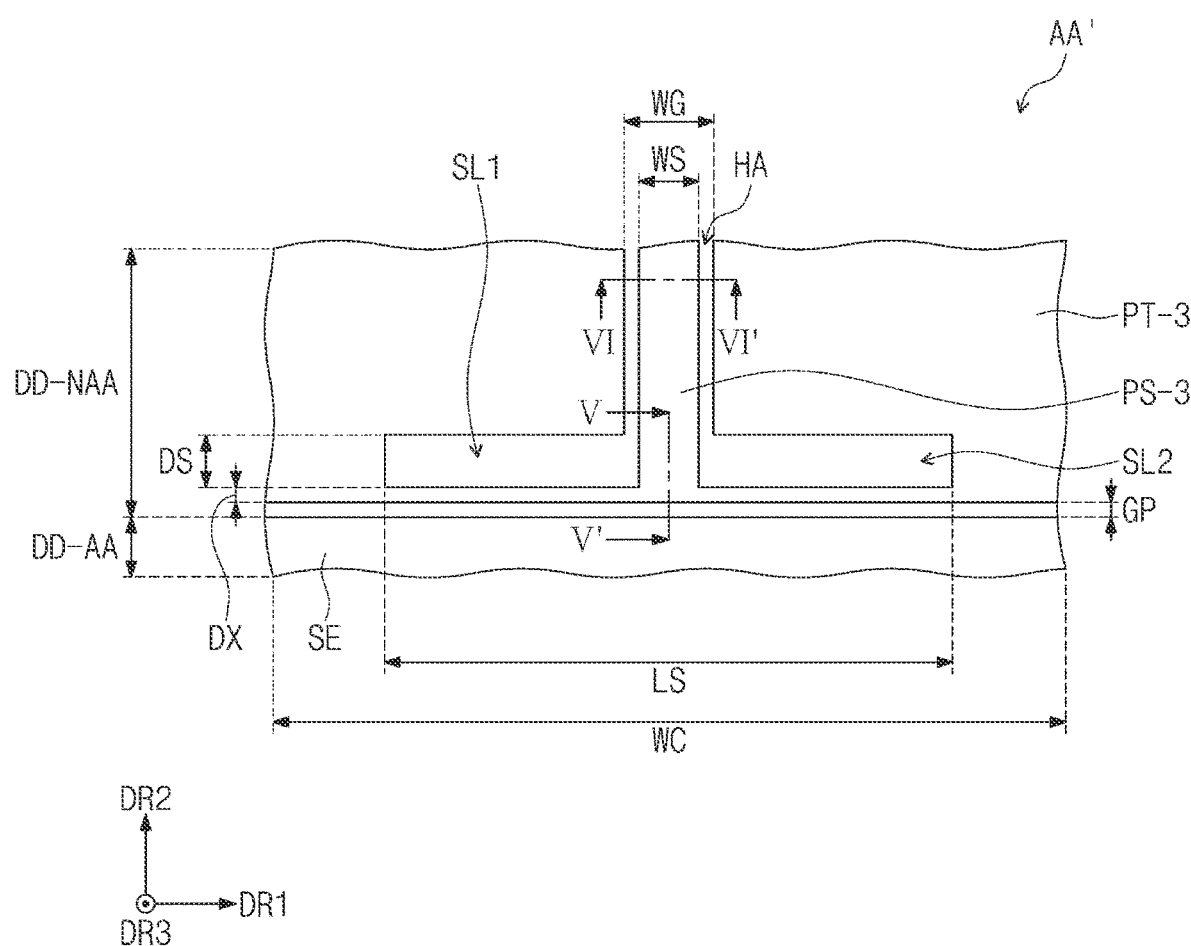
FIG. 17 is a plan view illustrating an area of an electronic device corresponding to AA' of FIG. 3 according to an embodiment of the present disclosure.

FIG. 17 is a plan view illustrating an area of an electronic device corresponding to AA' of FIG. 3 according to an embodiment of the present disclosure.

Referring to FIG. 17, a feeding part PS and a ground electrode PT-3 may be disposed in a peripheral area DD-NAA of the electronic device DD (refer to FIG. 1).

The feeding part PS-3 and the ground electrode PT-3 may transmit/receive signals at a preset first driving frequency. The feeding part PS and the ground electrode PT-3 may form a slotted loop dipole antenna. The first driving frequency may be about 27 gigahertz (GHz) to about 37 GHz. For example, the first driving frequency may be about 28 GHz. The feeding part PS-3 and the ground electrode PT-3 may include a conductive material. The conductive material may include a metal.

Unlike the present disclosure, the antenna pattern may be formed of a metal having a mesh structure or a transparent metal such as Indium-Tin-Oxide (ITO). In the case of having the mesh structure, the sheet resistance of the antenna pattern may be relatively increased by the mesh structure having a plurality of openings. In addition, when the transparent metal is included, the conductivity of the antenna pattern may be relatively low. When the sheet resistance of the antenna pattern is high or conductivity is low, antenna radiation efficiency and gain may be reduced. However, according to the present disclosure, the feeding part PS-3 and the ground electrode PT-3 may be provided as an integrally provided metal. Sheet resistance of the feeding part PS-3 and the ground electrode PT-3 may be lowered, and conductivity may be increased. Accordingly, it is possible to provide a feeding part PS-3 and a ground electrode PT-3 with improved antenna radiation efficiency and antenna gain.

The feeding part PS-3 may extend in the second direction DR2. The feeding part PS-3 may have a feeding width WS in the first direction DR1. The feeding width WS may be about 0.4 mm to about 0.5 mm. For example, the feeding width WS may be about 0.45 mm. When the feeding width WS is less than about 0.4 mm and more than about 0.5 mm, since the first slot SL1 and the second slot SL2 do not have impedance matching with the defined ground electrode PT-3, it may not be easy to supply a signal. The feeding part PS-3 may be provided integrally with the ground electrode PT-3. The feeding part PS-3 may be provided with the same material as the ground electrode PT-3.

The ground electrode PT-3 may be spaced apart from the feeding part PS-3 in the first direction DR1. A ground voltage may be provided to the ground electrode PT-3. The ground electrode PT-3 may be connected to the feeding part PS-3 extending in the second direction DR2.

A first slot SL1 and a second slot SL2 spaced apart from each other in the first direction DR1 with the feeding part PS-3 therebetween may be defined in the ground electrode PT-3. Each of the first slot SL1 and the second slot SL2 may have the same area.

A third slot HA extending in the second direction DR2 and in which the feeding part PS-3 is disposed may be further defined in the ground electrode PT-3.

Each of the first slot SL1 and the second slot SL2 may extend in the first direction DR1.

The first slot SL1 and the second slot SL2 may have a first width LS extending in the first direction DR1 from one end of the first slot SL1 to the other end of the second slot SL2. The first width LS may be about 3 mm to about 4 mm. For example, the first width LS may be about 3.4 mm. The third slot HA adjacent to the feeding part PS-3 may have a second width DS extending in the second direction DR2. The second width DS may be about 0.3 mm to about 0.4 mm. For example, the second width DS may be about 0.35 mm.

The third slot HA may have a first width WG extending in the first direction DR1. The first width WG may be about 0.25 mm to about 0.75 mm. For example, the first width WG may be about 0.53 mm.

When viewed on a plane, the sensing electrode SE may not overlap the feeding part PS-3 and the ground electrode PT-3.

Each of the feeding part PS-3 and the ground electrode PT-3 may be spaced apart from the sensing electrode SE in the second direction DR2. When viewed on a plane, the ground electrode PT-3 may be spaced apart from the sensing electrode SE by the gap GP in the second direction DR2. The gap GP may act as a capacitance between the feeding part PS-3 and the ground electrode PT-3 and the sensing electrode SE.

The signal provided to the sensing electrode SE may operate at the second driving frequency. The feeding part PS-3 and the ground electrode PT-3 may operate at the first driving frequency. The second driving frequency may be lower than the first driving frequency. For example, the second driving frequency may be about 240 kilohertz (kHz).

From the perspective of the sensing electrode SE, since the feeding part PS-3 and the ground electrode PT-3 are operated at a relatively high driving frequency, an open circuit may be operated between the sensing electrode SE, the feeding part PS-3, and the ground electrode PT-3. That is, the touch signal provided to the sensing electrode SE may not be provided to the ground electrode PT-3 to which the ground voltage is provided. Accordingly, the electronic device DD (see FIG. 1) with improved touch sensing performance may be provided.

From the perspective of the feeding part PS-3 and the ground electrode PT-3, since the sensing electrode SE operates at a relatively low driving frequency, a short circuit may be operated between the feeding part PS-3, the ground electrode PT-3, and the sensing electrode SE. That is, the feeding part PS-3 and the ground electrode PT-3 may utilize the sensing electrode SE as a floating ground electrode. Accordingly, it is possible to provide the electronic device DD (see FIG. 1) having improved frequency signal emission performance.

Figure 18:
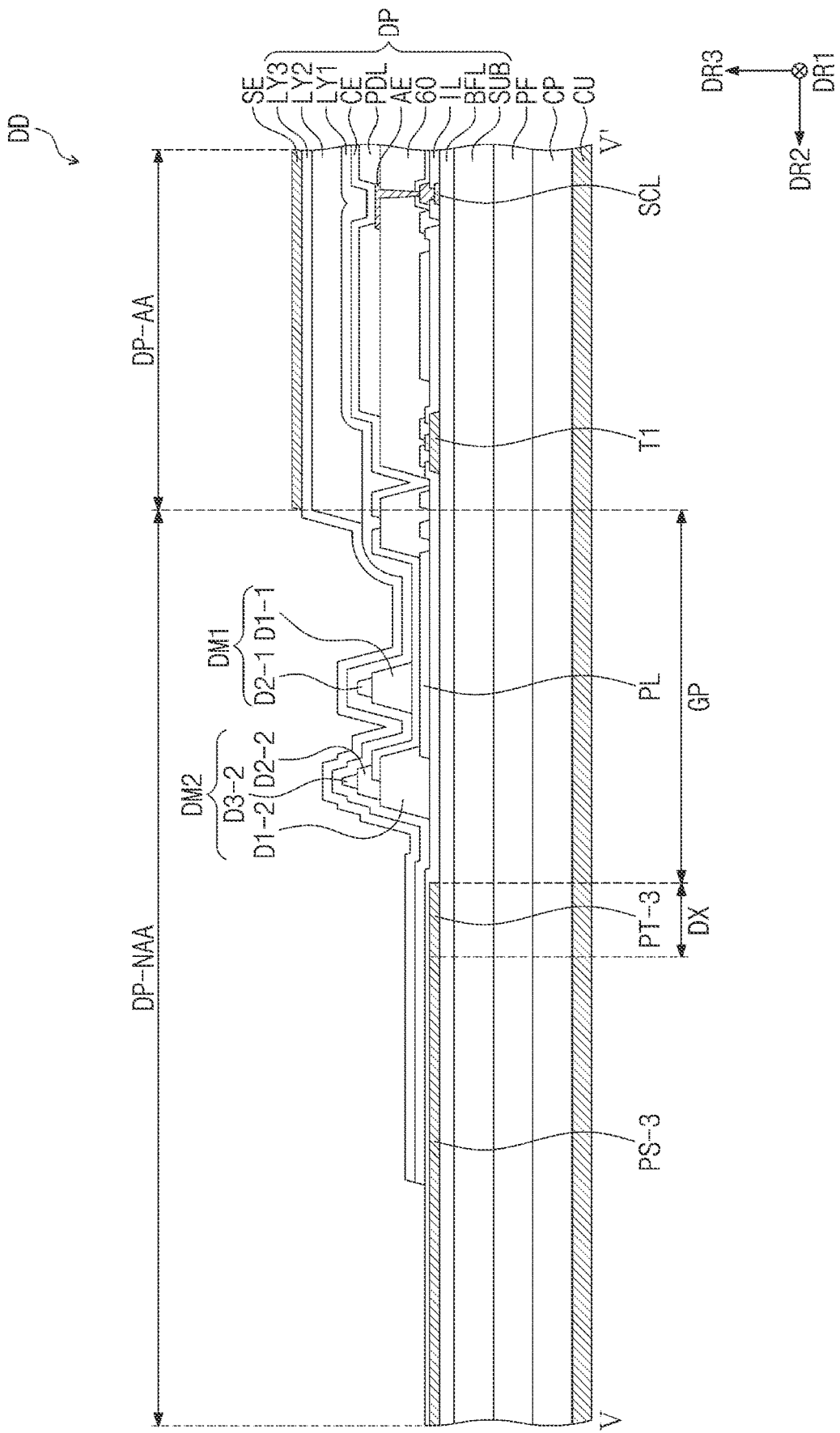
FIG. 18 is a cross-sectional view taken along line V-V' of FIG. 7 according to an embodiment of the present disclosure.

FIG. 18 is a cross-sectional view taken along line V-V' of FIG. 7 according to an embodiment of the present disclosure. In the description of FIG. 18, the same reference numerals are used for the components described with reference to FIG. 4, and a description thereof will be omitted.

Referring to FIGS. 17 and 18, in the electronic device DD, a cover layer CU, a lower member layer CP, a protective layer PF, and a display layer DP may be sequentially stacked.

The display layer DP may include a base layer SUB, a buffer layer BFL, a plurality of insulating layers IL, and a sixth insulating layer 60.

The transistor T1 may be disposed on the buffer layer BFL. The transistor T1 may be electrically connected to the light emitting element OLED (see FIG. 4). The transistor T1 may be disposed in the active area DP-AA.

The plurality of insulating layers IL may be disposed on the buffer layer BFL. The plurality of insulating layers IL may include the first insulating layer 10 (see FIG. 4), the second insulating layer 20 (see FIG. 4), the third insulating layer 30 (see FIG. 4), the fourth insulating layer 40 (see FIG. 4), and the fifth insulating layer 50 (see FIG. 4).

The first protruding part DM1 and the second protruding part DM2 may be disposed on the plurality of insulating layers IL. The first protruding part DM1 and the second protruding part DM2 may be disposed to be spaced apart from each other in the second direction DR2. The first protruding part DM1 may be referred to as a first dam. The second protruding part DM2 may be referred to as a second dam.

When the organic monomer is printed to form the organic layer LY2, the first protruding part DM1 and the second protruding part DM2 may prevent the organic monomer from overflowing.

Each of the first protruding part DM1 and the second protruding part DM2 may have a plurality of stacked structures. For example, the first protruding part DM1 may include a first protruding portion D1-1 disposed on the power wire PL and a second protruding portion D1-2 disposed on the first protruding portion D1-1. The second protruding part DM2 may include a first protruding portion D2-1 disposed on the plurality of insulating layers IL, a second protruding portion D2-2 disposed on the first protruding portion D2-1, and a third protruding portion D3-2 disposed on the second protruding portion D2-2.

The feeding part PS-3 and the ground electrode PT-3 may be disposed on the buffer layer BFL. However, this is an example, and the arrangement relationship of the feeding part PS-3 and the ground electrode PT-3 according to an embodiment of the present disclosure is not limited thereto. For example, the feeding part PS-3 and the ground electrode PT-3 may be disposed between the plurality of insulating layers IL. The feeding part PS-3 and the ground electrode PT-3 may be disposed in a peripheral area DP-NAA. A plurality of feeding parts PS-3 disposed in the peripheral area DP-NAA may be provided.

A portion of the feeding part PS-3, the ground electrode PT-3, and the transistor T1 may be disposed on the same layer. For example, the feeding part PS-3 and the ground electrode PT-3 may be disposed on the same layer as the source S1 (see FIG. 4), the active A1 (see FIG. 4), and the drain D1 (see FIG. 4), or may be disposed on the same layer as the gate G1 (see FIG. 4). The feeding part PS-3, the ground electrode PT-3, and the transistor T1 may be formed by the same process. A portion of the feeding part PS-3, the ground electrode PT-3, and the transistor T1 may include the same material.

According to the present disclosure, the feeding part PS-3 and the ground electrode PT-3 for transmitting, receiving, or transmitting and receiving a plurality of wireless communication signals, for example, a plurality of radio frequency signals may be disposed in the peripheral area DP-NAA. The electronic device DD may not need a separate antenna film. The feeding part PS-3 and the ground electrode PT-3 may be formed on the same layer as a portion of the transistor T1 in the display layer DP. Accordingly, the thickness of the electronic device DD may be reduced.

Further, according to the present disclosure, the feeding part PS-3 and the ground electrode PT-3 may be disposed in the peripheral area DP-NAA. When viewed on a plane, the active area DD-AA (see FIG. 1) displaying an image may not overlap the feeding part PS-3 and the ground electrode PT-3. The quality of the image displayed by the display layer DP may be prevented from being deteriorated by the feeding part PS-3 and the ground electrode PT-3. Accordingly, the electronic device DD having improved display quality may be provided.

The cover layer CU may overlap the feeding part PS-3 and the ground electrode PT-3. The cover layer CU may act as a ground electrode for the feeding part PS-3.

The feeding part PS-3 and the ground electrode PT-3 may be spaced apart from the sensing electrode SE.

The sensing electrode SE may not overlap the feeding part PS-3 and the ground electrode PT-3. The sensing electrode SE may be spaced apart from the feeding part PS-3 in the second direction DR2. The sensing electrode SE and the ground electrode PT-3 may be spaced apart from each other by the gap GP in the second direction DR2.

According to the present disclosure, the sensing electrode SE may overlap the active area DP-AA, and the feeding part PS-3 and the ground electrode PT-3 may be disposed in the peripheral area DP-NAA. When viewed on a plane, the active area IS-AA (see FIG. 5) for sensing a touch may not overlap the feeding part PS-3 and the ground electrode PT-3. The deterioration of the touch sensing performance sensed by the sensor layer IS (see FIG. 5) by the feeding part PS-3 and the ground electrode PT-3 may be prevented. Accordingly, the electronic device DD having improved touch sensing performance may be provided.

Figure 19:
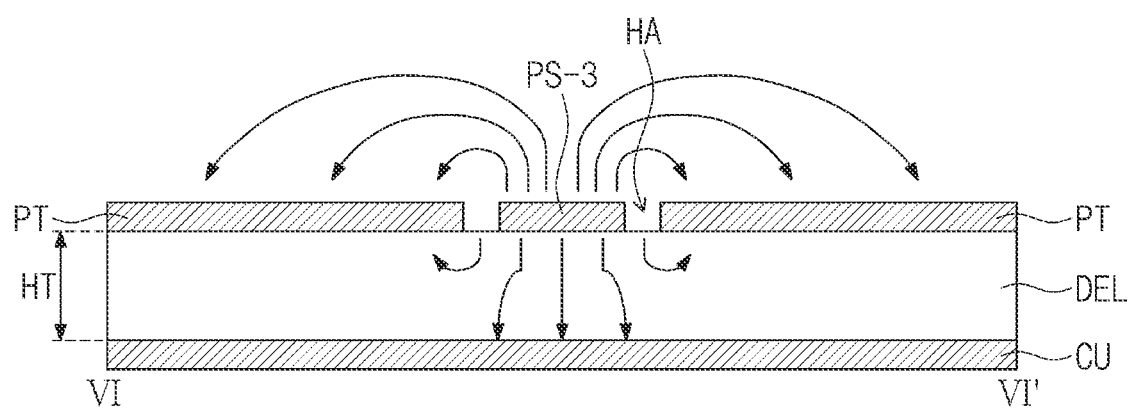
FIG. 19 is a cross-sectional view taken along VI-VI' of FIG. 7 according to an embodiment of the present disclosure.
Figure 19:
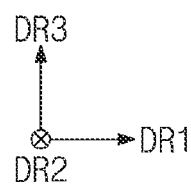

FIG. 19 is a cross-sectional view taken along line VI-VI' of FIG. 17 according to an embodiment of the present disclosure. In the description of FIG. 19, the same reference numerals are used for the components described with reference to FIGS. 17 and 18, and a description thereof will be omitted. In FIG. 19, the electric field distribution in the coplanar waveguide is indicated by arrows.

Referring to FIG. 19, the feeding part PS-3 may include a coplanar waveguide.

A signal may be provided to the feeding part PS-3 and the ground electrode PT-3 adjacent to the first slot SL1 (see FIG. 17) and the second slot SL2 (see FIG. 17) through the feeding part PS-3. A third slot HA may be defined between the feeding part PS-3 and the ground electrode PT-3. The ground electrode PT-3 may be spaced apart from each other with the third slot HA therebetween. A ground voltage may be provided to the ground electrode PT-3.

The insulating layer DEL may be disposed under the feeding part PS-3 and the ground electrode PT-3. The insulating layer DEL may include a base layer SUB, a protective layer PF, and a lower member layer CP. The thickness HT of the insulating layer DEL may be about 100 micrometer (μm) to about 200 μm.

The cover layer CU may be spaced apart from the feeding part PS-3 and the ground electrode PT-3 with the insulating layer DEL therebetween. A ground voltage may be provided to the cover layer CU. The cover layer CU may act as a ground of the feeding part PS-3 and the ground electrode PT-3.

In the upper portion of the insulating layer DEL, an electric field may be distributed in a direction from the feeding part PS-3 toward the ground electrodes PT-3 on both sides. In addition, an electric field may be distributed in a direction from the feeding part PS-3 toward the cover layer CU inside the insulating layer DEL. At this time, the electric field inside the insulating layer DEL is not leaked to the outside by the cover layer CU. The coplanar waveguide has a structure in which the electric field is completely separated by the cover layer CU, and an upper area and a lower area with respect to the cover layer CU may not cause electromagnetic interference with each other. The feeding part PS-3 may easily transmit a signal through the coplanar waveguide.

Figure 20:
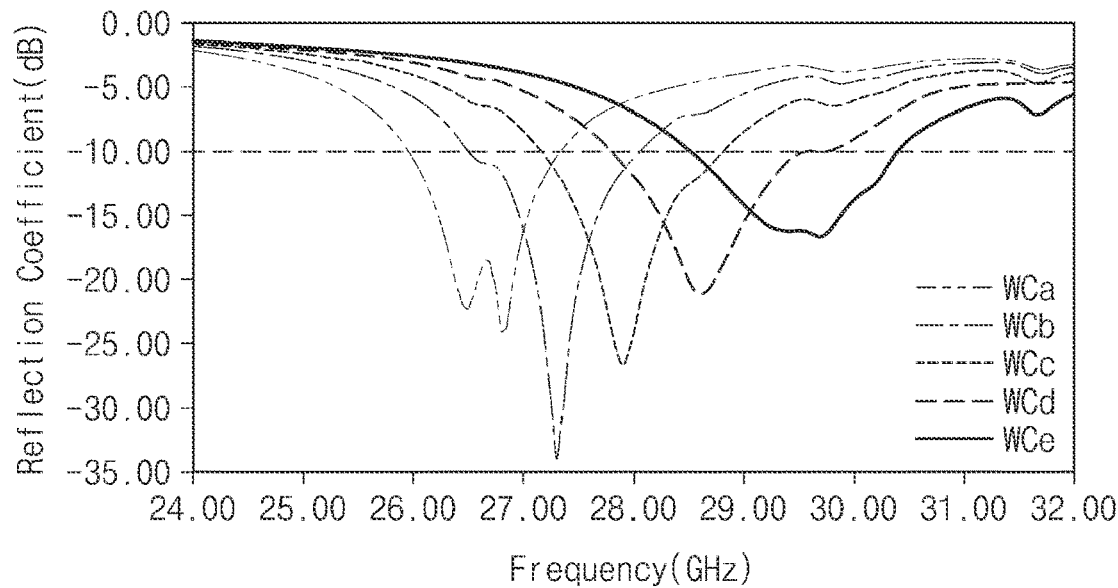
FIGS. 20 and 21 are graphs illustrating S-parameters according to frequency according to an embodiment of the present disclosure.
Figure 21:
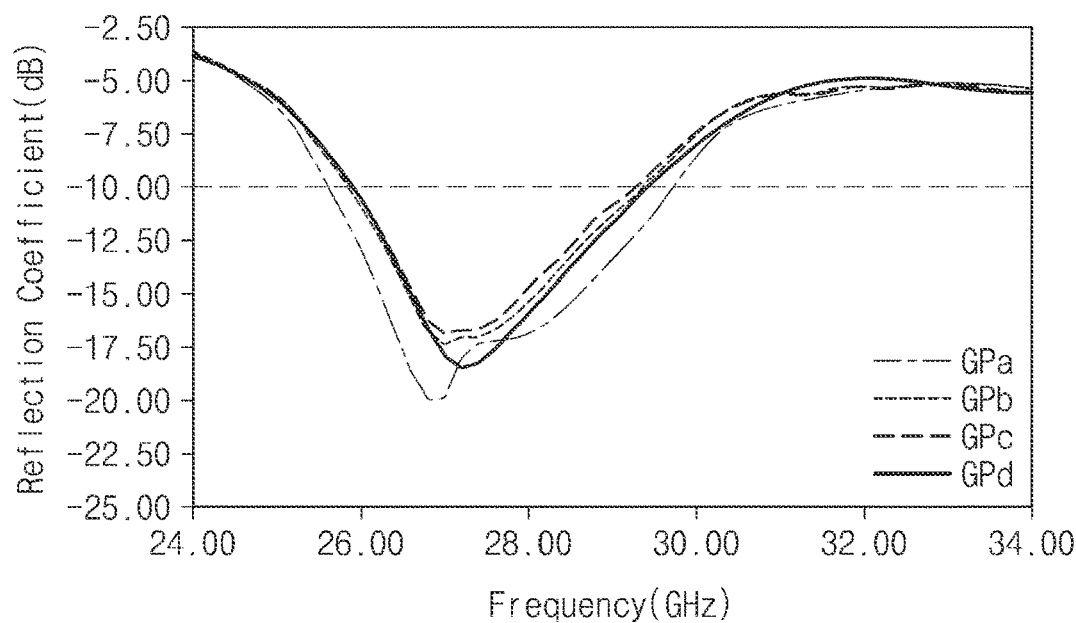

FIGS. 20 and 21 are graphs illustrating S-parameters according to frequency according to an embodiment of the present disclosure. FIG. 20 shows the S parameters according to the size of the width WC (see FIG. 17) in the first direction DR1 (see FIG. 17) of the ground electrode PT-3 (see FIG. 17), and FIG. 21 shows S-parameters according to the size of the first gap GP (see FIG. 17).

Referring to FIGS. 17, 20, and 21, the feeding part PS-3 and the ground electrode PT-3 may be designed to transmit, receive, or transmit/receive a signal having a frequency band.

S11 may be one of S-parameters. S11 may be a value representing a ratio of a magnitude of a signal that is reflected back of an input signal to a magnitude of the input signal. For example, the input signal may be a signal provided through a feeding part PS-3. For example, S11 may be a reflection coefficient of the feeding part PS-3 and the ground electrode PT-3. When determining the operation of the feeding part PS-3 and the ground electrode PT-3, it may be determined based on the case where the S11 value is −10 decibel (dB). −10 dB may be a case in which the input signal is reflected and the magnitude of the returned signal is 10% of that of the input signal. When S11 is less than −10 dB, it may be determined that the feeding part PS-3 and the ground electrode PT-3 operate in the corresponding frequency band.

Referring to FIG. 20, S parameters when the ground electrode PT-3 has first to fifth widths WCa, WCb, WCc, WCd, and WCe in the first direction DR1 are illustrated.

The first width WCa may be about 6.6 mm. When the ground electrode PT-3 has the first width WCa, the feeding part PS-3 and the ground electrode PT-3 may operate in a frequency bandwidth of about 26 GHz to about 27.3 GHz.

The second width WCb may be about 6.8 mm. When the ground electrode PT-3 has the second width WCb, the feeding part PS-3 and the ground electrode PT-3 may operate in a frequency bandwidth of about 26.5 GHz to about 28 GHz.

The third width WCc may be about 7.0 mm. When the ground electrode PT-3 has the third width WCc, the feeding part PS-3 and the ground electrode PT-3 may operate in a frequency bandwidth of about 27.3 GHz to about 29 GHz.

The fourth width WCd may be about 7.2 mm. When the ground electrode PT-3 has the fourth width WCd, the feeding part PS-3 and the ground electrode PT-3 may operate in a frequency bandwidth of about 28 GHz to about 29.5 GHz.

The fifth width WCe may be about 7.4 mm. When the ground electrode PT-3 has the fourth width WCd, the feeding part PS-3 and the ground electrode PT-3 may operate in a frequency bandwidth of about 28.5 GHz to about 30.5 GHz.

The electronic device DD (refer to FIG. 1) of the present disclosure may configure an antenna having various bandwidths according to the design of the width WC in the first direction DR1 of the ground electrode PT-3. Accordingly, the electronic device DD (refer to FIG. 1) with improved reliability may be provided.

According to the present disclosure, the frequency bandwidth operating in the feeding part PS-3 and the ground electrode PT-3 may be broadband. Accordingly, the electronic device DD (refer to FIG. 1) having an improved frequency bandwidth may be provided.

Referring to FIG. 21, S parameters are shown when the sensing electrode SE and the ground electrode PT-3 have first to fourth gaps GPa, GPb, GPc, and GPd in the second direction DR2, respectively.

The first gap GPa may be about 0.025 mm. When the sensing electrode SE and the ground electrode PT-3 are spaced apart by the first gap GPa, the feeding part PS-3 and the ground electrode PT-3 may operate in a frequency bandwidth of about 26 GHz to about 30 GHz.

The second gap GPb may be about 0.05 mm. When the sensing electrode SE and the ground electrode PT-3 are spaced apart by the second gap GPb, the feeding part PS-3 and the ground electrode PT-3 may operate in a frequency bandwidth of about 26.2 GHz to about 29.5 GHz.

The third gap GPc may be about 0.075 mm. When the sensing electrode SE and the ground electrode PT-3 are spaced apart by the third gap GPc, the feeding part PS-3 and the ground electrode PT-3 may operate in a frequency bandwidth of about 26.2 GHz to about 29.5 GHz.

The fourth gap GPd may be about 0.1 mm. When the sensing electrode SE and the ground electrode PT-3 are spaced apart by the fourth gap GPd, the feeding part PS-3 and the ground electrode PT-3 may operate in a frequency bandwidth of about 26.2 GHz to about 29.5 GHz.

The electronic device DD (see FIG. 1) of the present disclosure may configure an antenna having an optimal bandwidth according to a design in which the sensing electrode SE and the ground electrode PT-3 are spaced apart by the gap GP in the second direction DR2. Accordingly, the electronic device DD (refer to FIG. 1) with improved reliability may be provided.

Figure 22:
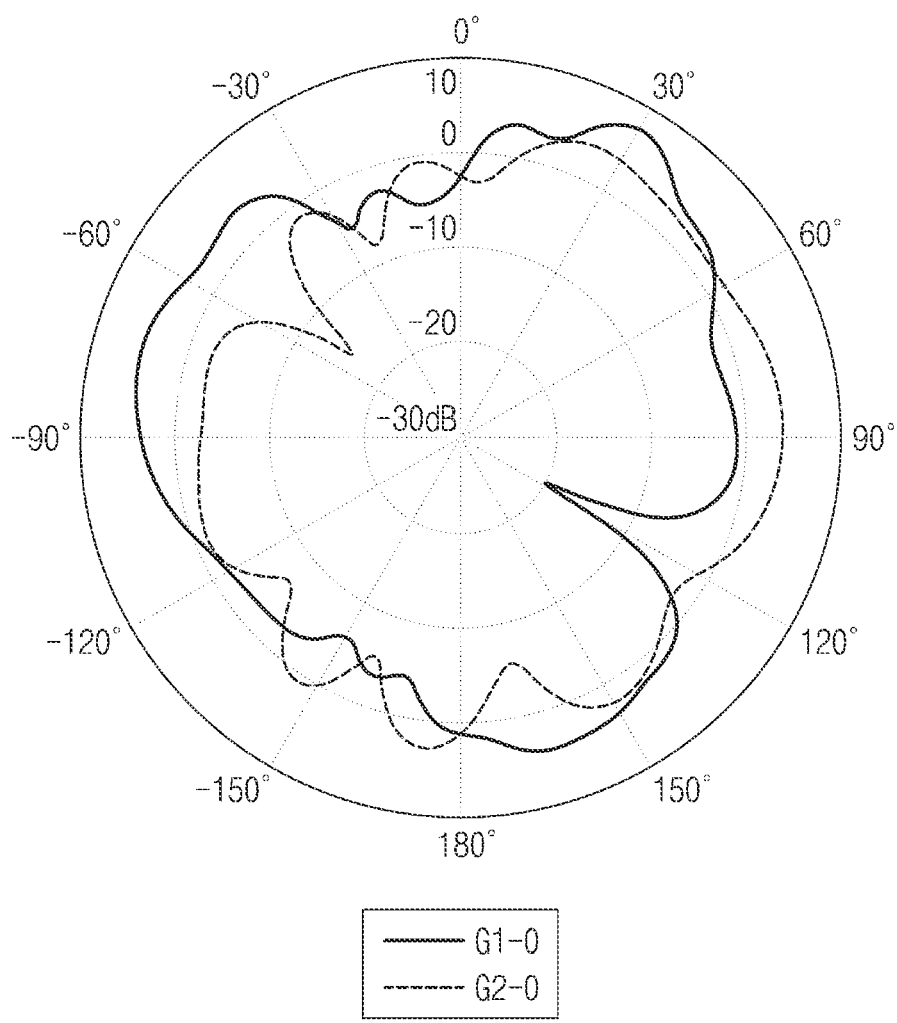
FIG. 22 shows a radiation pattern of the feeding part and the ground electrode according to an embodiment of the present disclosure.

FIG. 22 shows a radiation pattern of the feeding part and the ground electrode according to an embodiment of the present disclosure.

Referring to FIGS. 17, 18, 19, 20, 21, and 22, when the antenna gain is 0 dB or more in the radiation pattern, it may be said that the signal is radiated in the corresponding direction. About 0° in the direction may refer to the third direction DR3.

The first graph G1-0 shows a radiation pattern in a magnetic field. The first graph G1-0 is a radiation pattern in the x-z plane. The first graph G1-0 may be a radiation pattern of a cross-section obtained by cutting the feeding part PS-3 and the ground electrode PT-3 along the second direction DR2.

The second graph G2-0 shows a radiation pattern in the electric field. The second graph G2-0 is a radiation pattern in the y-z plane. The second graph G2-0 may be a radiation pattern of a cross-section obtained by cutting the feeding part PS-3 and the ground electrode PT-3 in the first direction DR1.

In the case of a super high frequency (SHF) or an extremely high frequency (EHF) having a high frequency band, a signal loss may be large according to a transmission distance. However, according to the present disclosure, the feeding part PS-3 and the ground electrode PT-3 may radiate a signal. The signal may have directionality. In the feeding part PS and the ground electrode PT-3, the concentration of antenna gain may be improved. Accordingly, the display device DD (refer to FIG. 1) having an improved signal transmission distance may be provided.

Figure 23:
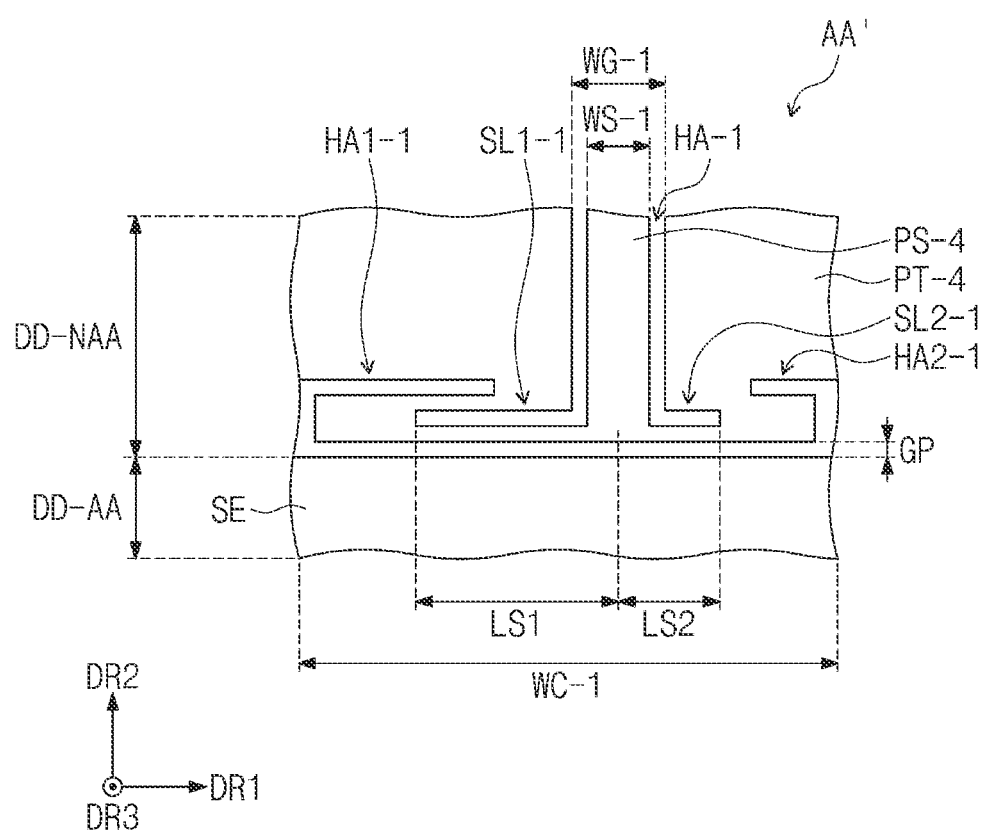
FIG. 23 is a plan view illustrating an area of an electronic device corresponding to AA' of FIG. 3 according to an embodiment of the present disclosure.

FIG. 23 is a plan view illustrating an area of an electronic device corresponding to AA' of FIG. 3 according to an embodiment of the present disclosure. In the description of FIG. 23, similar reference numerals are used for the components described with reference to FIG. 17, and a description thereof will be omitted.

Referring to FIG. 23, a feeding part PS-4 and a ground electrode PT-4 may be disposed in a peripheral area DD-NAA of the electronic device DD (refer to FIG. 1).

The feeding part PS-4 and the ground electrode PT-4 may transmit/receive signals at a preset first driving frequency. The feeding part PS-4 and the ground electrode PT-4 may include a conductive material. The conductive material may include a metal.

The feeding part PS-4 may extend in the second direction DR2. The feeding part PS-4 may have a feeding width WS-1 in the first direction DR1. According to the feeding width WS-1, the feeding part PS-4 may be impedance-matched with the ground electrode PT-4 in which the first slot SL1-1 and the second slot SL2-1 are defined.

The feeding part PS-4 may be provided integrally with the ground electrode PT-4. The feeding part PS-4 may be provided with the same material as the ground electrode PT-4.

The ground electrode PT-4 may be spaced apart from the feeding part PS-4 in the first direction DR1. A ground voltage may be provided to the ground electrode PT-4. The ground electrode PT-4 may be connected to the feeding part PS-4 extending in the second direction DR2.

A first slot SL1-1 and a second slot SL2-1 spaced apart from each other in the first direction DR1 with the feeding part PS-4 therebetween may be defined in the ground electrode PT-4. The first area of the first slot SL1-1 and the second area of the second slot SL2-1 may be different from each other. The first slot SL1-1 may have a first length LS1 in the first direction DR1. The second slot SL2-1 may have a second length LS2 in the first direction DR1. The first length LS1 may be longer than the second length LS2.

A third slot HA-1 extending in the second direction DR2 and in which the feeding part PS-4 is disposed may be further defined in the ground electrode PT-4.

At least one of opening parts HA1-1 and HA2-1 adjacent to the first slot SL1-1 or the second slot SL2-1 may be further defined in the ground electrode PT-4. For example, a first opening part HA1-1 adjacent to the first slot SL1-1 and a second opening part HA2-1 adjacent to the second slot SL2-1 may be defined in the ground electrode PT-4.

The first opening part HA1-1 may have a larger area than the first slot SL1-1. The first opening part HA1-1 may be further spaced apart from the sensing electrode SE in the second direction DR2 than the first slot SL1-1.

The second opening part HA2-1 may have a larger area than the second slot SL2-1. The second opening part HA2-1 may be further spaced apart from the sensing electrode SE in the second direction DR2 than the second slot SL2-1.

Figure 24:
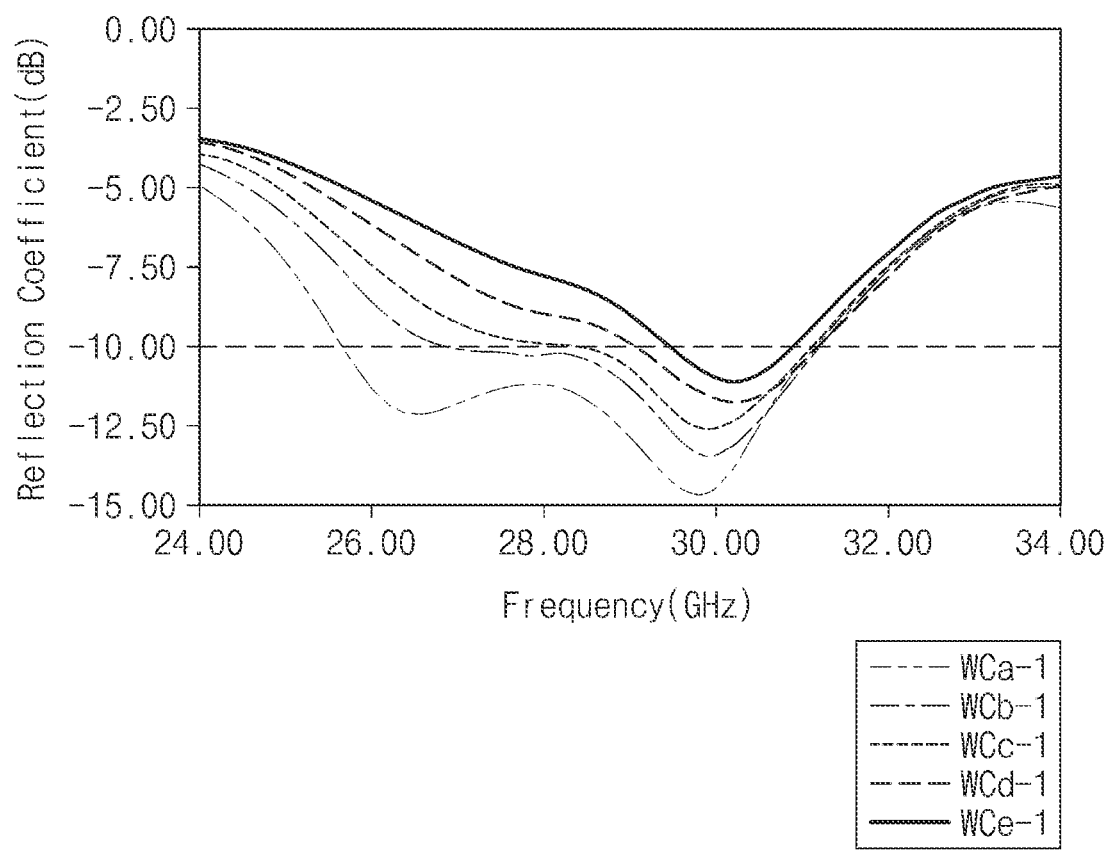
FIGS. 24, 25, 26, and 27 are graphs illustrating S-parameters according to frequency according to an embodiment of the present disclosure.
Figure 25:
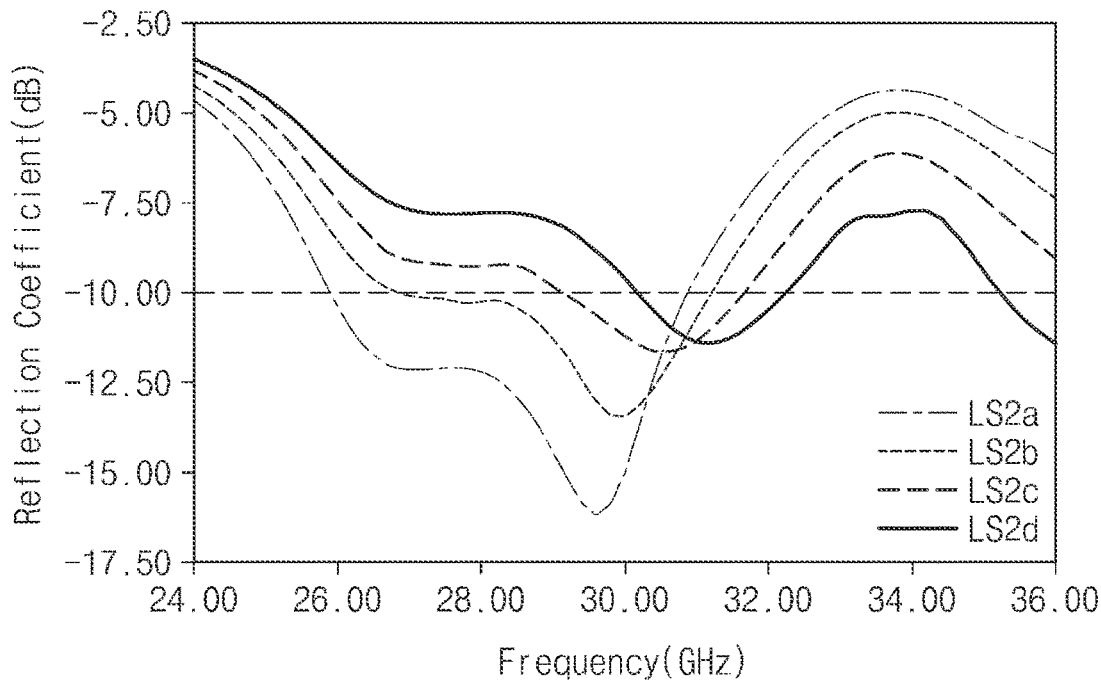
Figure 26:
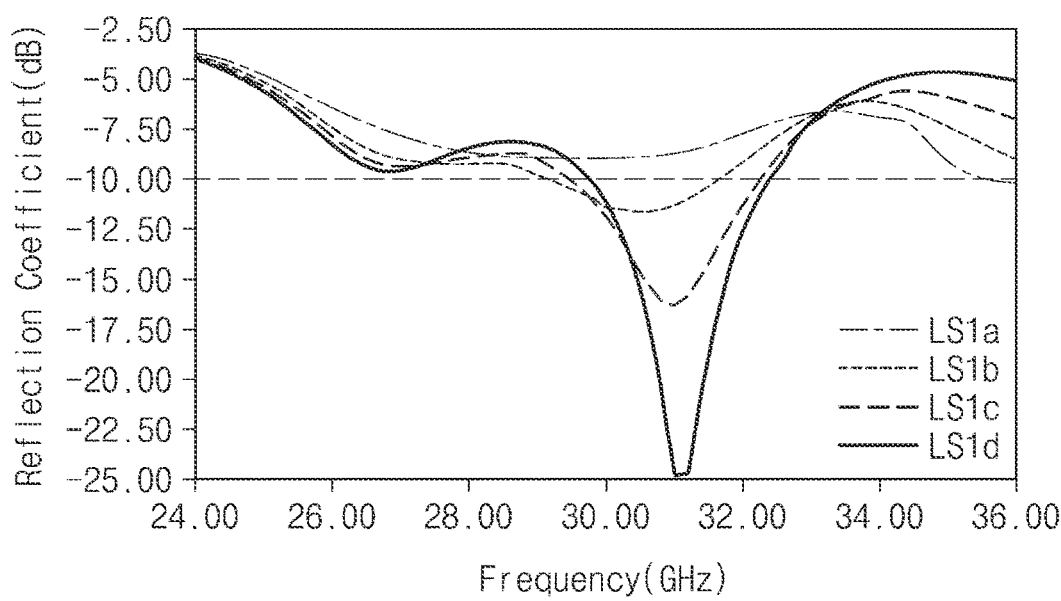
Figure 27:
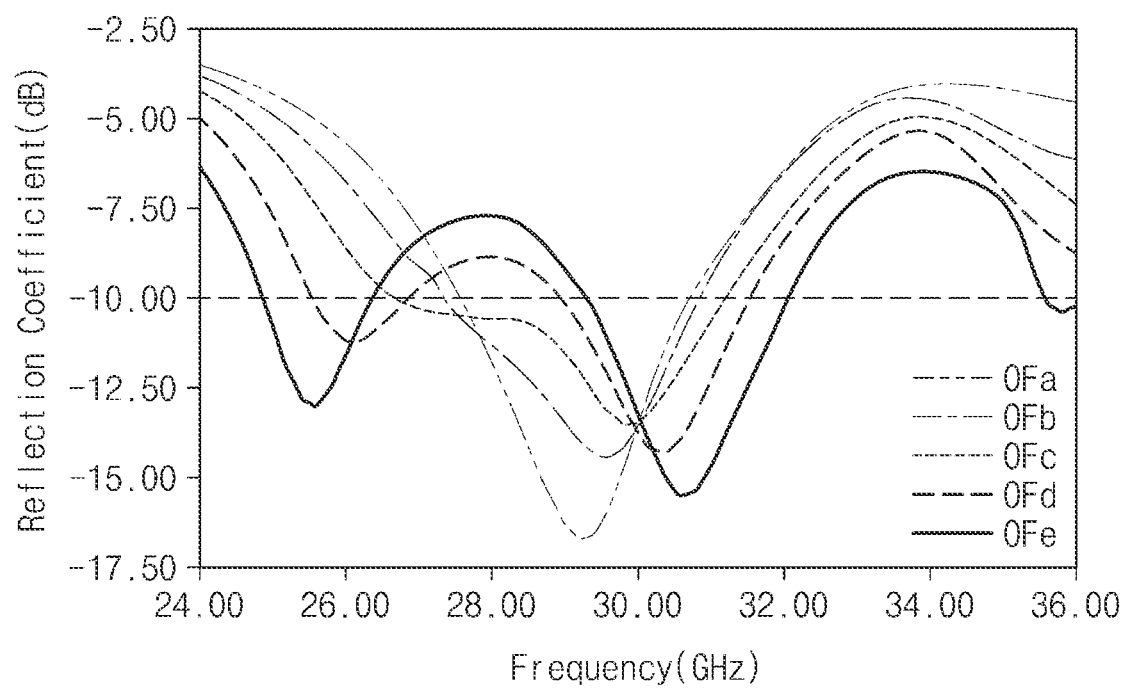

FIGS. 24, 25, 26, and 27 are graphs illustrating S-parameters according to frequency according to an embodiment of the present disclosure. FIG. 24 shows the S parameters according to the size of the width WC-1 (see FIG. 13) in the first direction DR1 (see FIG. 13) of the ground electrode PT-4 (see FIG. 13), FIG. 25 shows the S parameters according to the length of the second length LS2 (see FIG. 13), FIG. 26 shows the S parameter according to the length of the first length LS1 (see FIG. 13), and FIG. 27 shows S parameters according to the absolute value of the difference between the first length LS1 (see FIG. 13) and the second length LS2 (see FIG. 13). In the description of FIGS. 24, 25, 26, and 27, the same reference numerals are used for the components described with reference to FIG. 20, and descriptions thereof are omitted.

Referring to FIGS. 23 and 24, S parameters are shown when the ground electrode PT-4 has first to fifth widths WCa-1, WCb-1, WCc-1, WCd-1, and WCe-1, respectively, in the first direction DR1.

The first width WCa-1 may be about 4.8 mm. When the ground electrode PT-4 has the first width WCa-1, the feeding part PS-4 and the ground electrode PT-4 may operate in a frequency bandwidth of about 26 GHz to about 31 GHz.

The second width WCb-1 may be about 5 mm. When the ground electrode PT-4 has the second width WCb-1, the feeding part PS-4 and the ground electrode PT-4 may operate in a frequency bandwidth of about 27 GHz to about 31 GHz.

The third width WCc-1 may be about 5.2 mm. When the ground electrode PT-4 has the third width WCc-1, the feeding part PS-4 and the ground electrode PT-4 may operate in a frequency bandwidth of about 28 GHz to about 31 GHz.

The fourth width WCd-1 may be about 5.4 mm. When the ground electrode PT-4 has the fourth width WCd-1, the feeding part PS-4 and the ground electrode PT-4 may operate in a frequency bandwidth of about 29 GHz to about 31 GHz.

The fifth width WCe-1 may be about 5.6 mm. When the ground electrode PT-4 has the fifth width WCe-1, the feeding part PS-4 and the ground electrode PT-4 may operate in a frequency bandwidth of about 29.5 GHz to about 31 GHz.

The electronic device DD (refer to FIG. 1) of the present disclosure may configure an antenna having various frequency bandwidths according to the design of the width WC-1 in the first direction DR1 of the ground electrode PT-4. Accordingly, the electronic device DD (refer to FIG. 1) with improved reliability may be provided.

According to the present disclosure, the frequency bandwidth operating in the feeding part PS-4 and the ground electrode PT-4 may be wideband. Accordingly, the electronic device DD (refer to FIG. 1) having an improved frequency bandwidth may be provided.

Referring to FIG. 25, S parameters when the second slot SL2-1 has first to fourth lengths LS2a, LS2b, LS2c, and LS2d in the first direction DR1 are illustrated. In this case, the first length LS1 in the first direction DR1 of the first slot SL1-1 may be about 0.354 mm.

The first length LS2a may be about 2.454 mm. When the second slot SL2-1 has a first length LS2a in the first direction DR1, the feeding part PS-4 and the ground electrode PT-4 may operate in a frequency bandwidth of about 25.9 GHz to about 30.87 Hz.

The second length LS2b may be about 2.354 mm. When the second slot SL2-1 has a second length LS2b in the first direction DR1, the feeding part PS-4 and the ground electrode PT-4 may operate in a frequency bandwidth of about 26.85 GHz to about 31.5 GHz.

The third length LS2c may be about 2.254 mm. When the second slot SL2-1 has a third length LS2c in the first direction DR1, the feeding part PS-4 and the ground electrode PT-4 may operate in a frequency bandwidth of about 29.12 GHz to about 32 GHz.

The fourth length LS2d may be about 2.154 mm. When the second slot SL2-1 has a fourth length LS2d in the first direction DR1, the feeding part PS-4 and the ground electrode PT-4 may operate with a frequency bandwidth of about 30.17 GHz to about 32.5 GHz and a frequency bandwidth greater than about 35.22 GHz.

The electronic device DD (refer to FIG. 1) of the present disclosure may configure an antenna having various frequency bandwidths according to the design of the width WC-1 in the first direction DR1 of the ground electrode PT2. Accordingly, the electronic device DD (refer to FIG. 1) with improved reliability may be provided.

Referring to FIG. 26, S parameters when the first slot SL1-1 has first to fourth lengths LS1a, LS1b, LS1c, and LS1d in the first direction DR1 are illustrated. In this case, the second length LS2 in the first direction DR1 of the second slot SL2-1 may be about 2.254 mm.

The first length LS1a may be about 0.454 mm. When the first slot SL1-1 has a first length LS1a in the first direction DR1, the feeding part PS-4 and the ground electrode PT-4 may operate with a frequency bandwidth of greater than about 35.54 GHz.

The second length LS1b may be about 0.354 mm. When the first slot SL1-1 has a second length LS1b in the first direction DR1, the feeding part PS-4 and the ground electrode PT-4 may operate in a frequency bandwidth of about 29.12 GHz to about 31.66 GHz.

The third length LS1c may be about 0.254 mm. When the first slot SL1-1 has a third length LS1c in the first direction DR1, the feeding part PS-4 and the ground electrode PT-4 may operate in a frequency bandwidth of about 29.45 GHz to about 32.26 GHz.

The fourth length LS1d may be about 0.154 mm. When the first slot SL1-1 has a fourth length LS1d in the first direction DR1, the feeding part PS-4 and the ground electrode PT-4 may operate in a frequency bandwidth of about 29.5 GHz to about 32.3 GHz.

In the electronic device DD (refer to FIG. 1) of the present disclosure, the first slot SL1-1 may configure an antenna having an optimal bandwidth according to the design of the first length LS1 in the first direction DR1. Accordingly, the electronic device DD (refer to FIG. 1) with improved reliability may be provided.

Referring to FIG. 27, S parameters when the absolute value of the difference between the first length LS1 (see FIG. 13) and the second length LS2 (see FIG. 13) has the first to fifth values OFa, OFb, OFc, OFd, and OFe are shown.

The first value OFa may be about 0.5 mm. When the absolute value of the difference between the first length LS1 and the second length LS2 has a first value OFa, the feeding part PS-4 and the ground electrode PT-4 may operate in a frequency bandwidth of about 27.5 GHz to about 30.7 GHz.

The second value OFb may be about 0.75 mm. When the absolute value of the difference between the first length LS1 and the second length LS2 has a second value OFb, the feeding part PS-4 and the ground electrode PT-4 may operate in a frequency bandwidth of about 27.35 GHz to about 30.84 GHz.

The third value OFc may be about 1 mm. When the absolute value of the difference between the first length LS1 and the second length LS2 has a third value OFc, the feeding part PS-4 and the ground electrode PT-4 may operate in a frequency bandwidth of about 27.5 GHz to about 31.2 GHz.

The fourth value OFd may be about 1.25 mm. When the absolute value of the difference between the first length LS1 and the second length LS2 has a fourth value OFd, the feeding part PS-4 and the ground electrode PT-4 may operate in a frequency bandwidth of about 25.55 GHz to about 26.87 GHz and a frequency bandwidth of about 28.94 GHz to about 31.53 GHz.

The fifth value OFe may be about 1.5 mm. When the absolute value of the difference between the first length LS1 and the second length LS2 has a fifth value OFe, the feeding part PS-4 and the ground electrode PT-4 may operate in a frequency bandwidth of about 24.87 GHz to about 26.37 GHz, a frequency bandwidth of about 29.28 GHz to about 32.06 GHz, and a frequency bandwidth greater than about 35.57 GHz.

The electronic device DD (refer to FIG. 1) of the present disclosure may configure an antenna having an optimal frequency bandwidth according to the design of the absolute value of the difference between the first length LS1 (see FIG. 13) and the second length LS2 (see FIG. 13). Accordingly, the electronic device DD (refer to FIG. 1) with improved reliability may be provided.

Figure 28:
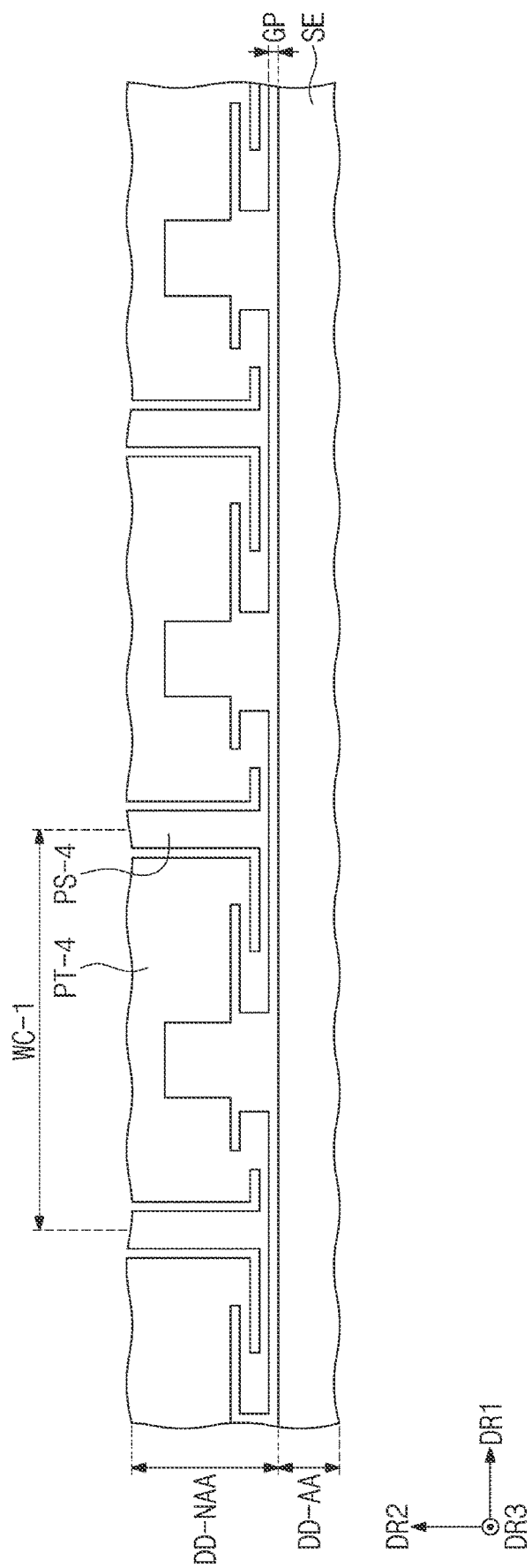
FIG. 28 is a plan view illustrating a portion of a peripheral area of an electronic device according to an embodiment of the present disclosure.

FIG. 28 is a plan view illustrating a portion of a non-display area of an electronic device according to an embodiment of the present disclosure. In the description of FIG. 28, the same reference numerals are used for the components described with reference to FIG. 23, and a description thereof will be omitted.

Referring to FIG. 28, a plurality of feeding parts PS-4 may be provided. The plurality of feeding parts PS-4 may be arranged along the first direction DR1.

The ground electrode PT-4 may be disposed between the two feeding parts PS-4. The ground electrode PT-4 may be integrally provided by being connected to the plurality of feeding parts PS-4 in the second direction DR2.

Figure 29:
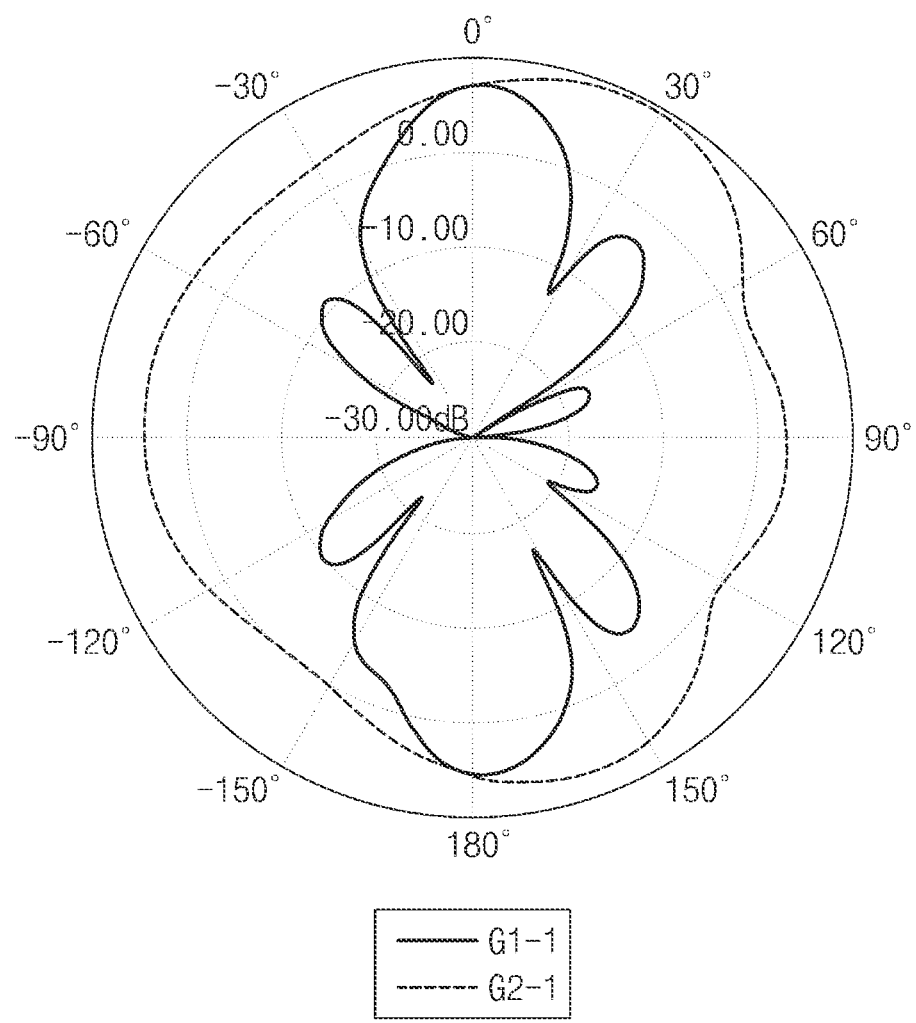
FIG. 29 is a view showing the same polarization radiation pattern of a plurality of feeding parts and a ground electrode according to an embodiment of the present disclosure.
Figure 30:
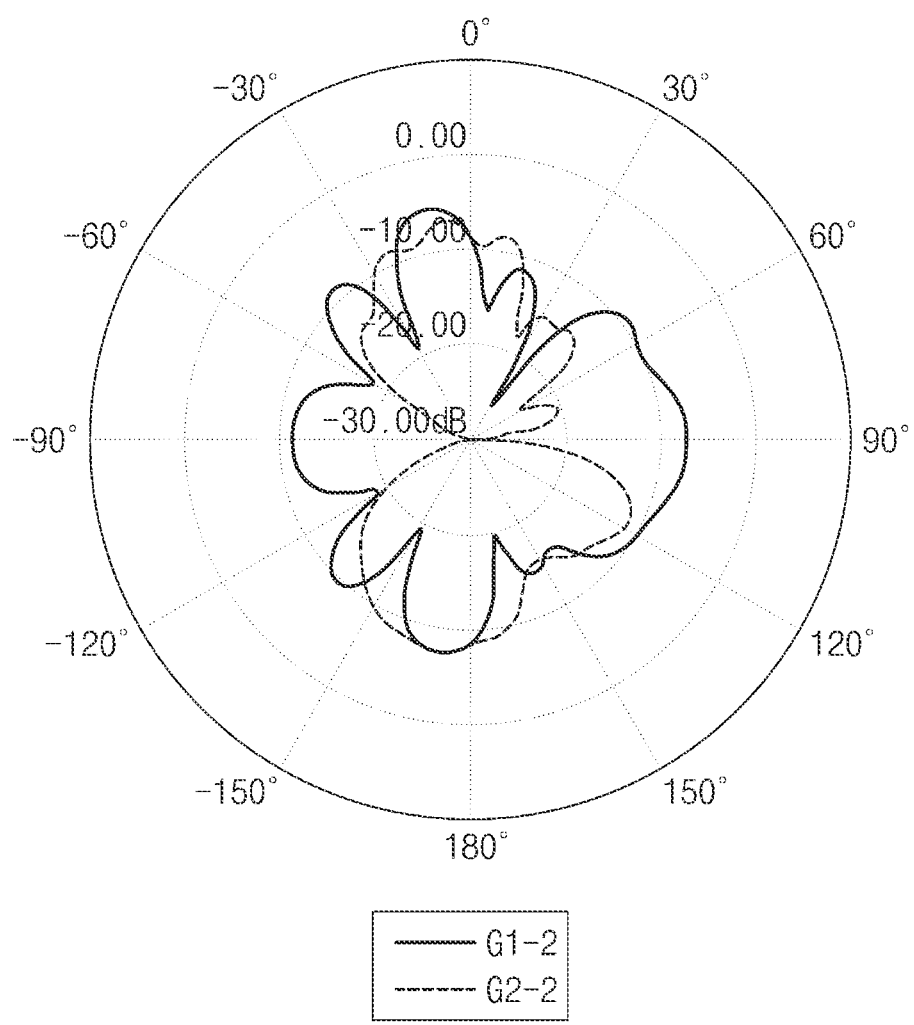
FIG. 30 illustrates a cross-polarized radiation pattern of a plurality of feeding parts and a ground electrode according to an embodiment of the present disclosure.

FIG. 29 is a view showing the same polarization radiation pattern of a plurality of feeding parts and a ground electrode according to an embodiment of the present disclosure, and FIG. 30 illustrates a cross-polarized radiation pattern of a plurality of feeding parts and a ground electrode according to an embodiment of the present disclosure.

Referring to FIGS. 28, 29, and 30, when the antenna gain is 0 dB or more in the radiation pattern, it may be said that the signal is radiated in the corresponding direction. About 0° in the direction may refer to the third direction DR3.

The first graph G1-1 shows a radiation pattern in a magnetic field. The first graph G1-1 is a radiation pattern in the x-z plane. The first graph G1-1 may be a radiation pattern of a cross-section obtained by cutting the feeding part PS-4 and the ground electrode PT-4 in the second direction DR2.

The second graph G2-1 shows a radiation pattern in the electric field. The second graph G2-1 is a radiation pattern in the y-z plane. The second graph G2-1 may be a radiation pattern of a cross-section obtained by cutting the feeding part PS-4 and the ground electrode PT-4 in the first direction DR1.

The first graph G1-1 and the second graph G2-1 show radiation patterns at the same polarization. The same polarization may indicate a desired polarization component when the feeding part PS-4 and the ground electrode PT-4 radiate a signal. In the first graph G1-1 and the second graph G2-1, a component having a signal strength of 0 dB or more exists at 0° and 180°, which may mean that the signal is radiated in this direction.

The third graph G1-2 shows a radiation pattern in a magnetic field. The third graph G1-2 is a radiation pattern in the x-z plane.

The fourth graph G2-2 shows a radiation pattern in the electric field. The fourth graph G2-2 may be a radiation pattern in the y-z plane.

The third graph G1-2 and the fourth graph G2-2 illustrate radiation patterns in cross polarization. In the feeding part PS-4 and the ground electrode PT-4 radiating the signal, the cross polarization is a perpendicular polarization component of the same polarization component and may be an illustration of an unwanted polarization component. In the third graph G1-2 and the fourth graph G2-2, there is no component greater than 0 dB in signal strength, which may mean that an unwanted component does not appear.

In the case of a super high frequency (SHF) or an extremely high frequency (EHF) having a high frequency band, a signal loss may be large according to a transmission distance. However, according to the present disclosure, the feeding part PS-4 and the ground electrode PT-4 may radiate a signal in a desired direction. The signal may have directionality. In the feeding part PS-4 and the ground electrode PT-4, the concentration of antenna gain may be improved. Accordingly, the display device DD (refer to FIG. 1) having an improved signal transmission distance may be provided.

Although the embodiments of the present disclosure have been described, it is understood that the present disclosure should not be limited to these embodiments but various changes and modifications may be made by one ordinary skilled in the art within the spirit and scope of the present disclosure as hereinafter claimed.

What is claimed is:

1. An electronic device comprising:
a display layer in which an active area and a peripheral area adjacent to the active area are defined; and
a cover layer disposed under the display layer,
wherein the display layer includes:
a base layer;
a circuit layer including a transistor and a feeding part and disposed on the base layer; and
a light emitting element layer including a light emitting element electrically connected to the transistor and disposed on the circuit layer,
wherein the feeding part including a coplanar waveguide is disposed on the same layer as a part of the transistor, and
wherein, when viewed on a plane, the cover layer overlaps the feeding part.

2. The electronic device of claim 1, wherein the circuit layer further includes a first antenna pattern disposed on a same layer as the feeding part.

3. The electronic device of claim 2, wherein the first antenna pattern is provided integrally with the feeding part, and
wherein, when viewed on a plane, the cover layer overlaps the first antenna pattern.

4. The electronic device of claim 2, further comprising a sensor layer including a sensing electrode and disposed on the display layer.

5. The electronic device of claim 4, wherein, when viewed on the plane, the sensing electrode does not overlap the feeding part.

6. The electronic device of claim 4, wherein the first antenna pattern is spaced apart from the sensing electrode in a first direction.

7. The electronic device of claim 2, wherein the first antenna pattern is provided in plurality,
wherein the plurality of first antenna patterns are spaced apart from the feeding part in a first direction, and
wherein each of the plurality of first antenna patterns is spaced apart from each other in a second direction intersecting the first direction.

8. The electronic device of claim 2, wherein the first antenna pattern includes a same material as the transistor.

9. The electronic device of claim 2, wherein, when viewed on the plane, the first antenna pattern overlaps the cover layer.

10. The electronic device of claim 2, further comprising a driving chip for providing a signal to the first antenna pattern through the feeding part.

11. The electronic device of claim 1, wherein the transistor is disposed in the active area, and
wherein the feeding part is disposed in the peripheral area.

12. The electronic device of claim 1, further comprising an antenna layer including a second antenna pattern and disposed on the display layer.

13. The electronic device of claim 12, wherein the second antenna pattern is connected to the feeding part.

14. An electronic device comprising:
a display layer in which an active area and a peripheral area adjacent to the active area are defined; and
a cover layer including a conductive material and disposed under the display layer,
wherein the display layer includes:
a base layer;
a circuit layer including a transistor, a feeding part, and an antenna pattern connected to the feeding part and disposed on the base layer; and
a light emitting element layer including a light emitting element electrically connected to the transistor and disposed on the circuit layer,
wherein the antenna pattern is disposed on a same layer as a portion of the transistor, and
wherein the transistor is disposed in the active area, and the antenna pattern is disposed in the peripheral area.

15. The electronic device of claim 14, wherein the feeding part includes a coplanar waveguide.

16. The electronic device of claim 14, further comprising a sensor layer including a sensing electrode and disposed on the display layer.

17. The electronic device of claim 16, wherein, when viewed on a plane, the sensing electrode does not overlap the feeding part.

18. The electronic device of claim 14, wherein the antenna pattern includes a same material as the transistor.

19. The electronic device of claim 14, further comprising a driving chip electrically connected to the feeding part and providing a signal to the antenna pattern.

20. The electronic device of claim 14, wherein the antenna pattern is provided in plurality,
wherein the plurality of antenna patterns are spaced apart from the feeding part in a first direction, and
wherein each of the plurality of antenna patterns is spaced apart from each other in a second direction intersecting the first direction.

21. An electronic device comprising a display layer in which an active area and a peripheral area adjacent to the active area are defined,
wherein the display layer includes:
a base layer;
a circuit layer including a transistor, a ground electrode, and a feeding part and disposed on the base layer; and
a light emitting element layer including a light emitting element electrically connected to the transistor and disposed on the circuit layer,
wherein the feeding part is directly disposed on a same layer as a part of the transistor, and
wherein the feeding part is spaced apart from the ground electrode in a first direction, the feeding part extends in a second direction intersecting the first direction, and the feeding part and the ground electrode are integrally connected to each other in the second direction.

22. The electronic device of claim 21, wherein the feeding part and the ground electrode form a slotted loop dipole antenna.

23. The electronic device of claim 21, further comprising a sensor layer including a sensing electrode and disposed on the display layer.

24. The electronic device of claim 23, wherein a first slot and a second slot spaced apart from each other in the first direction with respect to the feeding part therebetween are defined in the ground electrode, and
wherein each of the first slot and the second slot has a shape extending in the first direction.

25. The electronic device of claim 24, wherein an area of each of the first slot and the second slot is equal to each other.

26. The electronic device of claim 24, wherein a first area of the first slot and a second area of the second slot are different from each other.

27. The electronic device of claim 26, wherein at least one opening part adjacent to the first slot or the second slot is defined in the ground electrode, and
wherein at least one opening part is further spaced apart from the sensing electrode in the second direction than the first slot and the second slot.

28. The electronic device of claim 26, wherein the feeding part is provided in plurality, and the plurality of feeding parts are arranged along the first direction.

29. The electronic device of claim 23, wherein, when viewed on a plane, the sensing electrode does not overlap the feeding part.

30. The electronic device of claim 23, wherein the ground electrode is spaced apart from the sensing electrode in the second direction.

31. The electronic device of claim 21, wherein each of the feeding part and the ground electrode includes a same material as the transistor.

32. The electronic device of claim 21, further comprising a driving chip for providing a signal to the feeding part.

33. The electronic device of claim 21, wherein the transistor is disposed in the active area, and
wherein the feeding part is disposed in the peripheral area.

34. The electronic device of claim 21, further comprising a cover layer disposed under the display layer,
wherein, when viewed on a plane, the cover layer overlaps the feeding part.

35. The electronic device of claim 34, wherein, when viewed on a plane, the ground electrode overlaps the cover layer.

36. The electronic device of claim 21, wherein the feeding part includes a coplanar waveguide.

* * * * *